United States Patent
Klenner et al.

(10) Patent No.: US 10,142,056 B2
(45) Date of Patent: Nov. 27, 2018

(54) TRANSMISSION METHOD, TRANSMITTER, RECEPTION METHOD, AND RECEIVER

(71) Applicant: Panasonic Corporation, Osaka (JP)

(72) Inventors: Peter Klenner, Frankfurt (DE); Mikihiro Ouchi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/158,641

(22) Filed: May 19, 2016

(65) Prior Publication Data

US 2016/0261371 A1  Sep. 8, 2016

Related U.S. Application Data

(63) Continuation of application No. PCT/JP2014/005854, filed on Nov. 21, 2014.

(30) Foreign Application Priority Data

Nov. 29, 2013  (EP) ..................................... 13195168
Nov. 6, 2014  (JP) ................................. 2014-226255

(51) Int. Cl.
*H03M 13/27* (2006.01)
*H04L 1/00* (2006.01)
(Continued)

(52) U.S. Cl.
CPC ......... *H04L 1/0041* (2013.01); *H03M 13/116* (2013.01); *H03M 13/1165* (2013.01);
(Continued)

(58) Field of Classification Search
None
See application file for complete search history.

(56) References Cited

U.S. PATENT DOCUMENTS 8,516,334 B2 * 8/2013 Xu ....................... H03M 13/116
714/758
2005/0129147 A1 * 6/2005 Cannon ................. H04L 1/0045
375/324
(Continued)

FOREIGN PATENT DOCUMENTS

EP  2288048  2/2011
EP  2525497  11/2012
(Continued)

OTHER PUBLICATIONS

International Search Report of PCT application No. PCT/JP2014/005854 dated Jan. 20, 2015.
(Continued)

*Primary Examiner* — Daniel McMahon
(74) *Attorney, Agent, or Firm* — Seed IP Law Group LLP

(57) ABSTRACT

In a transmission method according to one aspect of the present disclosure, a cyclic shift is applied to each row of an interleaver matrix in which each of a plurality of rotation components of each section is replaced with a cell, in which two rotation components are set to a real component and an imaginary component, by using (cyclic shift value $k \times$ floor $(Q/\max\{D, (N_{RF} \times N_C)\}/2)$) cells allocated to the row, and a value of $k \bmod N_{RF}$ varies in at least two rows of one section portion of a combined complex interleaver matrix in the cyclic shift.

6 Claims, 22 Drawing Sheets

(51) Int. Cl.
*H03M 13/11* (2006.01)
*H04L 5/00* (2006.01)
*H04L 27/26* (2006.01)
*H03M 13/25* (2006.01)

(52) U.S. Cl.
CPC ..... *H03M 13/1185* (2013.01); *H03M 13/255* (2013.01); *H03M 13/271* (2013.01); *H03M 13/2707* (2013.01); *H03M 13/2778* (2013.01); *H03M 13/2792* (2013.01); *H04L 1/0045* (2013.01); *H04L 1/0057* (2013.01); *H04L 1/0071* (2013.01); *H04L 5/0005* (2013.01); *H04L 27/2601* (2013.01)

(56) References Cited

U.S. PATENT DOCUMENTS

2006/0067422 A1* 3/2006 Chung ................ H04B 7/0669
375/295

2015/0188734 A1* 7/2015 Petrov ................ H03M 13/116
375/260
2016/0119176 A1* 4/2016 Jeong ................ H04B 7/0413
714/776

FOREIGN PATENT DOCUMENTS

| | | |
|---|---|---|
| EP | 2618532 | 7/2013 |
| EP | 2690791 | 1/2014 |
| EP | 2690813 | 1/2014 |

OTHER PUBLICATIONS

Extended European Search Report dated Nov. 16, 2016, for corresponding EP Application No. 14866685.2-1874 / 3076556, 10 pages.

* cited by examiner

FIG. 10

|  | 1 | 2 | 3 | ......... | 7 | Q=8 | |
|---|---|---|---|---|---|---|---|
| QB1 | b1 | b2 | b3 | b4 | b5 | b6 | b7 | b8 |
| QB2 | b9 | b10 | b11 | b12 | b13 | b14 | b15 | b16 |
| QB3 | b17 | b18 | b19 | b20 | b21 | b22 | b23 | b24 |
| QB4 | b25 | b26 | b27 | b28 | b29 | b30 | b31 | b32 |

SECTION IS1

| QB5 | b33 | b34 | b35 | b36 | b37 | b38 | b39 | b40 |
|---|---|---|---|---|---|---|---|---|
| QB6 | b41 | b42 | b43 | b44 | b45 | b46 | b47 | b48 |
| QB7 | b49 | b50 | b51 | b52 | b53 | b54 | b55 | b56 |
| QB8 | b57 | b58 | b59 | b60 | b61 | b62 | b63 | b64 |

SECTION IS2

| QB9 | b65 | b66 | b67 | b68 | b69 | b70 | b71 | b72 |
|---|---|---|---|---|---|---|---|---|
| QB10 | b73 | b74 | b75 | b76 | b77 | b78 | b79 | b80 |
| QB11 | b81 | b82 | b83 | b84 | b85 | b86 | b87 | b88 |
| QB12 | b89 | b90 | b91 | b92 | b93 | b94 | b95 | b96 |

SECTION IS3

FIG. 11A

|   | 1 | 2 | 3 | ⋯⋯⋯⋯ | 7 | Q=8 |   |
|---|---|---|---|---|---|---|---|
|   | 1 | 3 | 5 | 7 | 9 | 11 | 13 | 15 |
|   | 2 | 4 | 6 | 8 | 10 | 12 | 14 | 16 | SECTION IS1 |
|   | 17 | 19 | 21 | 23 | 25 | 27 | 29 | 31 |
|   | 18 | 20 | 22 | 24 | 26 | 28 | 30 | 32 | SECTION IS2 |
|   | 33 | 35 | 37 | 39 | 41 | 43 | 45 | 47 |
|   | 34 | 36 | 38 | 40 | 42 | 44 | 46 | 48 | SECTION IS3 |
|   | Re | Im | Re | Im | Re | Im | Re | Im |

FIG. 11B

|   | 1 | 2 | 3 | ⋯⋯⋯⋯ | 7 | Q=8 |   |
|---|---|---|---|---|---|---|---|
|   | 1 | 3 | 5 | 7 | 9 | 11 | 13 | 15 |
|   | 10 | 12 | 14 | 16 | 2 | 4 | 6 | 8 | SECTION IS1 |
|   | 17 | 19 | 21 | 23 | 25 | 27 | 29 | 31 |
|   | 26 | 28 | 30 | 32 | 18 | 20 | 22 | 24 | SECTION IS2 |
|   | 33 | 35 | 37 | 39 | 41 | 43 | 45 | 47 |
|   | 42 | 44 | 46 | 48 | 34 | 36 | 38 | 40 | SECTION IS3 |
|   | Re | Im | Re | Im | Re | Im | Re | Im |

*FIG. 12*

|   | 1 | 2 | 3 | Q/2=4 |
|---|---|---|---|---|
|   | CELL 1 | CELL 2 | CELL 3 | CELL 4 |
|   | CELL 5 | CELL 6 | CELL 7 | CELL 8 |
|   | CELL 9 | CELL 10 | CELL 11 | CELL 12 |
|   | CELL 13 | CELL 14 | CELL 15 | CELL 16 |
|   | CELL 17 | CELL 18 | CELL 19 | CELL 20 |
|   | CELL 21 | CELL 22 | CELL 23 | CELL 24 |

FIG. 14A

| | 1 | 2 | 3 | Q/2=4 | |
|---|---|---|---|---|---|
| | CELL 1 | CELL 2 | CELL 3 | CELL 4 | SECTION IS1 |
| | CELL 5 | CELL 6 | CELL 7 | CELL 8 | |
| | CELL 9 | CELL 10 | CELL 11 | CELL12 | SECTION IS2 |
| | CELL 13 | CELL 14 | CELL 15 | CELL 16 | |
| | CELL 17 | CELL 18 | CELL 19 | CELL 20 | SECTION IS3 |
| | CELL 21 | CELL 22 | CELL 23 | CELL 24 | |

FIG. 14B

| | 1 | 2 | 3 | Q/2=4 | |
|---|---|---|---|---|---|
| | CELL 1 | CELL 2 | CELL 3 | CELL 4 | SECTION IS1 |
| | CELL 7 | CELL 8 | CELL 5 | CELL 6 | |
| | CELL 9 | CELL 10 | CELL 11 | CELL12 | SECTION IS2 |
| | CELL 15 | CELL 16 | CELL 13 | CELL 14 | |
| | CELL 17 | CELL 18 | CELL 19 | CELL 20 | SECTION IS3 |
| | CELL 23 | CELL 24 | CELL 21 | CELL 22 | |
| | ↓ | ↓ | ↓ | ↓ | |
| | RF1 | RF2 | RF1 | RF2 | |

TFS CYCLE 1    TFS CYCLE 2

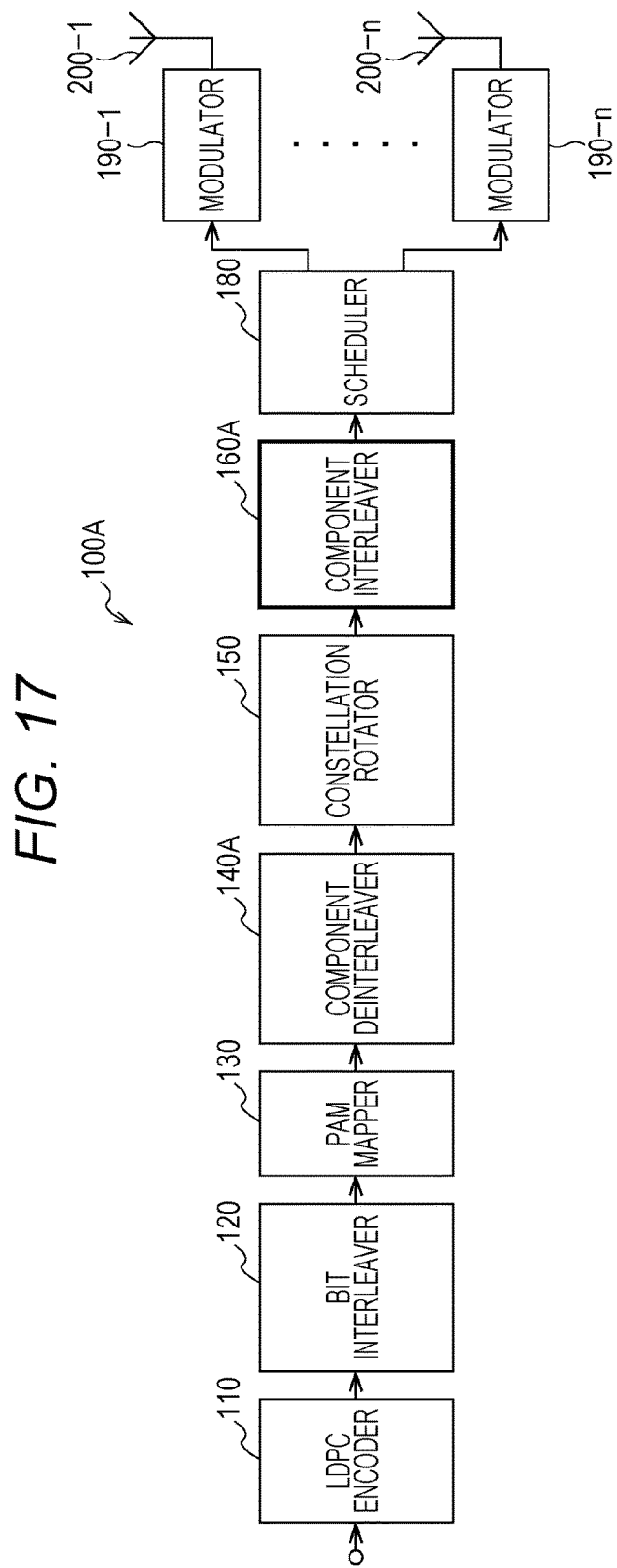

$D=4 \quad N_{RF}=3 \quad N_c=1$

TFS CYCLE 1

$D=4 \quad N_{RF}=3 \quad N_c=1$

TFS CYCLE 1

US 10,142,056 B2

TRANSMISSION METHOD, TRANSMITTER, RECEPTION METHOD, AND RECEIVER

BACKGROUND

1. Technical Field

The present disclosure relates to a digital communication field, particularly to a communication system technology in which a rotation constellation and a plurality of frequency channels are used together with a quasi-cyclic low-density parity check (QC LDPC) code.

2. Description of the Related Art

Conventionally, there is a communication system in which rotation constellation is used and data is transmitted and received with the plurality of frequency channels switched (for example, see PTL 1).

For example, a transmitter in the communication system converts a codeword based on the quasi-cyclic low-density parity check (QC LDPC) code into a plurality of components. D components are grouped, and a square orthogonal matrix of D rows and D columns is multiplied by a D-dimensional vector (D-dimensional constellation block) in which the D components are set to each dimensional value in each group (rotation processing).

The transmitter allocates D rotation components of the D-dimensional vector (each D-dimensional rotation constellation block), which is subjected to the rotation processing, to the plurality of frequency channels in order to obtain channel diversity.

CITATION LIST

Patent Literature

PTL 1: European Patent Application No. 2618532
PTL 2: European Patent Application No. 2288048
PTL 3: European Patent Application No. 2690813
PTL 4: European Patent Application No. 2690791
PTL 5: European Patent Application No. 2525497

SUMMARY

In one general aspect, the techniques disclosed here feature a transmission method for transmitting one coded block over $N_{RF}$ ($N_{RF}$ is an integer of 2 or more) frequency channels and $N_C$ ($N_C$ is an integer of 1 or more) cycles by dividing the one coded block into a plurality of slices, the transmission method including: coding a data block by using a quasi-cyclic low-density parity check (QC LDPC) code to generate a coded block, the coded block including N cyclic blocks, each of the N cyclic blocks including Q bits, each of the N cyclic blocks being divided into floor(N/M) sections and rem{N,M} cyclic blocks, each of the floor(N/M) sections including M cyclic blocks; generating a D-dimensional constellation block including D components from (Q×M) bits of corresponding one of the sections, each of the D number of components being a real value; generating a D-dimensional rotation constellation block including D rotation components from each of the D-dimensional constellation blocks of the sections by using an orthogonal matrix of D rows and D columns, each of the D rotation components being a real value; and mapping each of the rotation components of the D-dimensional rotation constellation blocks of each of the sections to one frequency channel of the $N_{RF}$ frequency channels. At this point, the mapping of each of the rotation components to the one frequency channel is performed by performing processing equivalent to: in each of the sections, writing the (D×Q) rotation components, in a column direction, in a real interleaver matrix of D rows and Q columns and converting the real interleaver matrix into a complex interleaver matrix of D rows and (Q/2) columns in which rotation components of two consecutive columns in an identical row are replaced with a cell that is of one complex value; coupling the complex interleaver matrix of D rows and (Q/2) columns for each of the sections to generate a combined complex interleaver matrix of ({floor(N/M)}×D) rows and (Q/2) columns by arranging the complex interleaver matrix of D rows and (Q/2) columns for each of the sections; applying a cyclic shift to each row of the combined complex interleaver matrix by using (cyclic shift value k×floor(Q/max{D,($N_{RF}$×$N_C$)}/2)) cells allocated to the row; and mapping cells as many as a number of consecutive columns defined by Q/2 of the post-cyclic-shift combined complex value interleaver matrix and $N_{RF}$×$N_C$ in the frequency channels while sequentially repeating the $N_{RF}$ frequency channels, and the cyclic shift is performed such that k that has a value equal to 2 or more is used at least once in each of the sections, the value of k being predetermined from values ranging from 0 to max{D,($N_{RF}$×$N_C$)}−1.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 10 is a view illustrating an example of a bit arrangement in the bit interleaver at a preceding stage of a PAM mapper in FIG. 9;

FIG. 11A is a view illustrating an example of a component arrangement during the writing by a component interleaver in FIG. 9;

FIG. 11B is a view illustrating an example of the component arrangement after a cyclic shift by the component interleaver in FIG. 9;

FIG. 12 is a view illustrating a cell arrangement during the writing performed by a cell interleaver in FIG. 9;

FIG. 14A is a view illustrating an example of the cell arrangement by a component interleaver in which two components in the component arrangement in FIG. 11A are replaced with one cell;

FIG. 14B is a view illustrating an example of the cell arrangement by a component interleaver in which two components of the component arrangement in FIG. 11B are replaced with one cell;

FIG. 17 is a block diagram illustrating a configuration example of a transmitter according to an exemplary embodiment of the present disclosure;

DETAILED DESCRIPTION (Study by the Inventors and Knowledge Obtained by Inventors)

First, a conventional communication system in which the rotation constellation is used together with the quasi-cyclic low-density parity check (QC LDPC) code and the time-frequency slicing (TFS) will be described.

Figure 1:
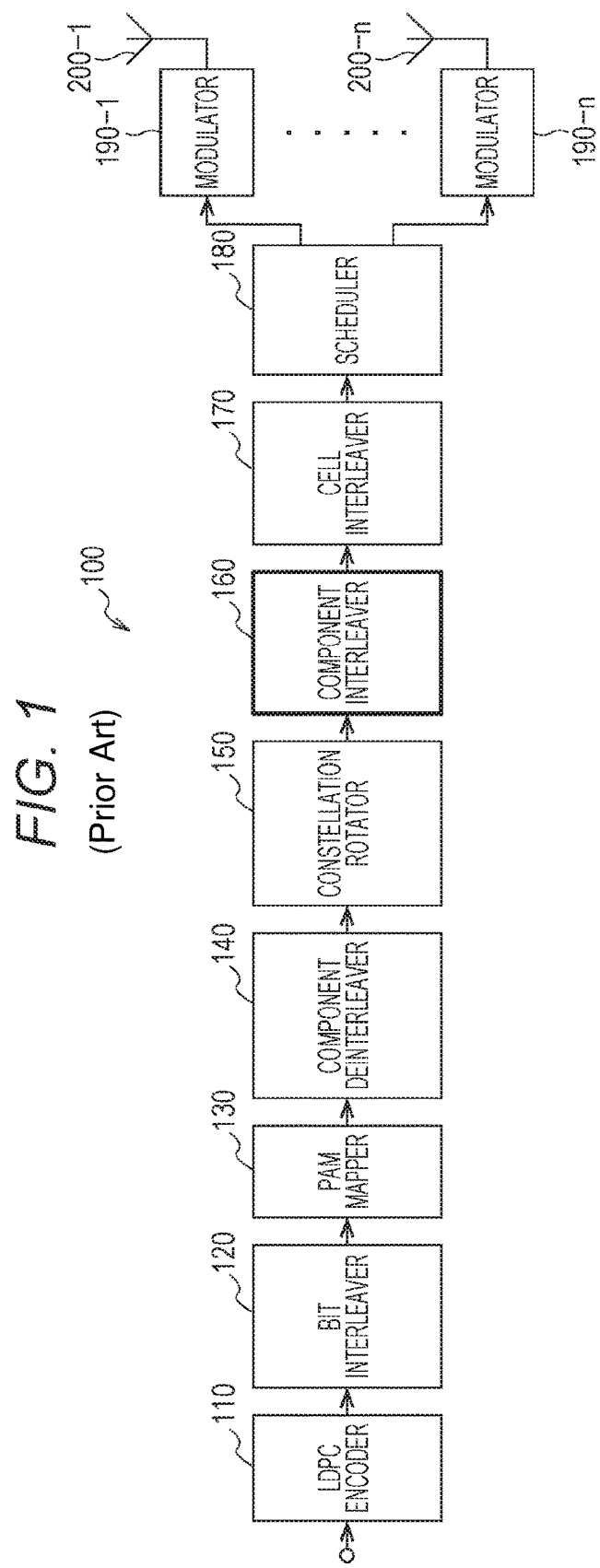
FIG. 1 is a block diagram illustrating a configuration example of a conventional transmitter in which a rotation constellation is used together with a quasi-cyclic low-density parity check code and time-frequency slicing.

FIG. 1 is a block diagram illustrating a configuration example of a conventional transmitter in which the rotation constellation is used together with the quasi-cyclic low-density parity check (QC LDPC) code and the time-frequency slicing (TFS). Note that the configuration example of the transmitter in FIG. 1 is simplified so as to include only the configuration associated with the present disclosure.

Transmitter 100 includes low-density parity check (LDPC) encoder 110, bit interleaver 120, PAM (pulse amplitude modulation) mapper 130, component deinterleaver 140, constellation rotator 150, component interleaver 160, cell interleaver 170, scheduler 180, modulators 190-1 to 190-$n$, and transmission antennas 200-1 to 200-$n$.

Transmitter 100 receives a predetermined-length binary block including information to be transmitted as input.

LDPC encoder 110 codes each information block using a low-density parity check code (for example, the quasi-cyclic low-density parity check code including a repeat-accumulate quasi-cyclic low-density parity check code). The coding processing includes calculation of a redundant bit and addition of the redundant bit to an information block in order that the information block becomes robuster against an error during decoding by a receiver.

A codeword (hereinafter, appropriately referred to as an "LDPC block") obtained through the coding processing is supplied to bit interleaver 120. Bit interleaver 120 performs bit interleaving, in which a plurality of bits of the LDPC block are rearranged based on a predetermined bit rearrangement rule, on the LDPC block.

The LDPC block subjected to the bit interleaving is supplied to PAM mapper 130. PAM mapper 130 sequentially outputs a predetermined number of bits in the supplied LDPC block while mapping the predetermined number of bits in a real-number PAM (real-valued pulse amplitude modulation) symbol (hereinafter, referred to as a "real PAM (real pulse amplitude modulation) symbol" or simply referred to as a "PAM symbol" as appropriate). The predetermined number is denoted by "B". Each PAM symbol takes one value from a discrete set including $2^B$ values. How the B bits are mapped in the PAM symbol is well understood, but not directly associated with the present disclosure. One of aspects associated with the present disclosure is that each LDPC block is converted into blocks of a plurality of PAM symbols. The two PAM symbols subsequently become a complex QAM symbol (complex quadrature amplitude modulation), and sometimes the complex QAM symbol is also referred to as a cell. A plurality of cells may arbitrarily be rearranged by the cell interleaver.

The plurality of PAM symbols obtained as a result of the mapping is supplied to component deinterleaver 140. Component deinterleaver 140 performs component deinterleaving, in which a plurality of components are rearranged according to a predetermined component rearrangement rule, with the PAM symbol as a component.

The plurality of PAM symbols subjected to the component deinterleaving are supplied to constellation rotator 150. Constellation rotator 150 performs dedicated conversion on the plurality of supplied PAM symbols. The dedicated conversion processing by constellation rotator 150 includes processing (rotation processing) in which the plurality of PAM symbols are grouped into D consecutively-supplied PAM symbols and, in each group, a square orthogonal matrix of D rows and D columns is multiplied by a D-dimensional vector in which D PAM symbols are used as a D-dimensional value.

At this point, the D-dimensional vector in which the D PAM symbols are used as the D-dimensional value is dealt with as the D-dimensional vector indicating a unique point in a D-dimensional space. In the case that each PAM symbol is formed by B bits, a D-dimensional constellation is formed by $(2^B)^D$ combinations. The multiplication of the matrix is considered to be the rotation in a D-dimensional space, and therefore a term "rotation constellation (rotated constellations)" is used.

The D-dimensional vector multiplied by the square orthogonal matrix is appropriately written as a "D-dimensional constellation block". The D-dimensional vector obtained by the multiplication of the square orthogonal matrix is appropriately written as a "D-dimensional rotation vector" or a "D-dimensional rotation constellation block", and each D-dimensional value of the D-dimensional rotation constellation block is appropriately written as a "rotation PAM symbol".

The D-dimensional constellation block rotation processing is an effective way to perform diversity in a fading channel. For example, PTL 2 discloses the D-dimensional constellation block rotation processing.

A plurality of rotation PAM symbols obtained through the rotation processing is supplied to component interleaver 160. Component interleaver 160 performs component interleaving, in which the plurality of components are rearranged according to a predetermined component rearrangement rule, with the rotation PAM symbol as the component.

In the plurality of components (rotation PAM symbols) subjected to the component interleaving, the two component are dealt with as one cell. The plurality of cells are supplied to cell interleaver 170. Cell interleaver 170 performs cell interleaving in which the plurality of cells are rearranged according to a predetermined cell rearrangement rule.

For example, PTLs 3 and 4 disclose the component deinterleaver, constellation rotator, component interleaver, and cell interleaver, which are connected in series.

The plurality of cells subjected to the cell interleaving is supplied to scheduler 180. Scheduler 180 performs processing, such as time-frequency slicing (TFS), in which the plurality of cells are arranged in an effective RF (radio frequency) channel according to a predetermined arrangement rule, and supplies the plurality of cells to modulators 190-1 to 190-$n$. A time interleaver (not illustrated) and a frequency interleaver (not illustrated) may be disposed between cell interleaver 170 and modulators 190-1 to 190-$n$ in order to spread a time and a frequency.

Modulators 190-1 to 190-$n$ perform modulation processing on a complex cell supplied from scheduler 180, and transmit the modulated complex cell through transmission antennas 200-1 to 200-$n$. Although there is no particular limitation to a modulation scheme, the modulation scheme may be orthogonal frequency-division multiplexing (OFDM).

A low-density parity check (LDPC) code used in LDPC encoder 110 will be described below.

As is well known in the digital communication field, the LDPC code is a linear error correction code that is completely defined by a parity-check matrix (PCM). The PCM is a binary sparse matrix that expresses connection between a codeword bit (also referred to as a "variable node") and a parity check (also referred to as a "check node"). The row and column of the PCM correspond to the variable node and the check node, respectively. The connection between the variable node and the check node is expressed by an entry of "1" (a value of "1" of a matrix element) in the PCM.

There is the quasi-cyclic low-density parity check (QC LDPC) code as one type of the LDPC code, and the QC LDPC code has a structure particularly suitable for a hardware implementation. Actually, nowadays the QC LDPC code is used in almost standards. The PCM of the QC LDPC code has a special structure having a plurality of circulant matrices (also referred to as "circulants"). The circulant matrix is a square matrix in which the matrix element is cyclically shifted by one row with respect to the preceding row, and sometimes has at least one cyclically shifted diagonal. Each circulant matrix has a size of the Q rows and Q columns, and Q is referred to as a cyclic factor of the QC LDPC code. Parallel processing can be performed on Q check nodes because of the quasi-cyclic structure, and the QC LDPC code clearly has an advantage to the efficient hardware implementation.

Figure 2:
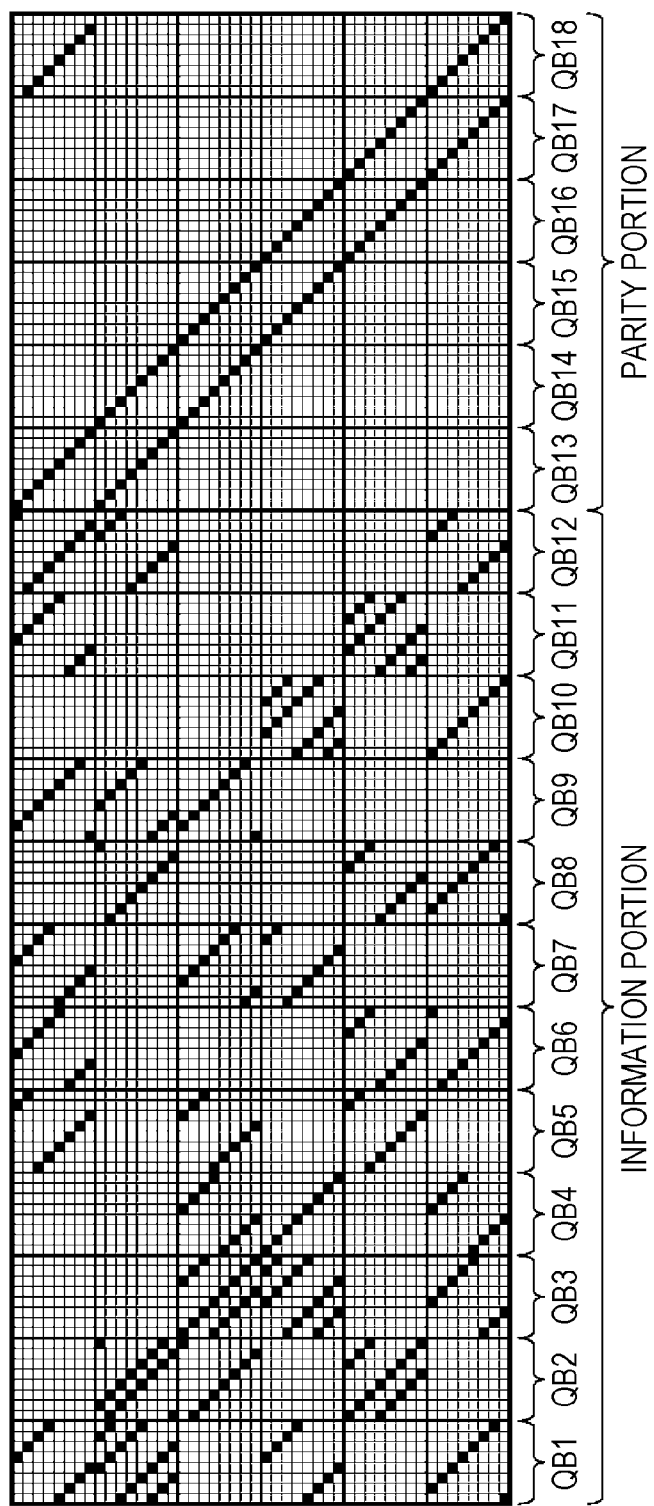
FIG. 2 is a view illustrating an example of a parity check matrix of the quasi-cyclic low-density parity check code.

FIG. 2 is a view illustrating an example of the PCM of the QCL DPC code having the cyclic factor Q of "8". The PCM includes the plurality of circulant matrices each of which has the diagonal cyclically shifted once or twice. In the PCM of FIG. 2, the matrix element having a value of "1" is indicated by a black square, and the matrix element having a value of "0" is indicated by a white square.

The QC LDPC code in FIG. 2 is a code that codes a 96-bit block (8×12=96) into a 144-bits codeword (8×18=144), and a coding rate is 96/144=2/3. The codeword bit is divided into 8-bit blocks (Q=8). The Q-bit block is referred to as a "cyclic block" or "quasi-cyclic block", and appropriately written as "QB".

The QC LDPC code of the PCM in FIG. 2 belongs to a special kind of QC LDPC code that is known as a repeat-accumulate quasi-cyclic low-density parity check (RA QC LDPC) code. The RA QC LDPC code is well known because of easy coding, and adapted in many standards such as a second-generation DVB standard including DVB-S2, DVB-T2, and DVB-C2. The RA QC LDPC code has a structure in which positions of the matrix elements having the value of "1" are arranged stepwise on a right side (parity portion) corresponding to a parity bit of the PCM. A left side of the PCM is a portion (information portion) corresponding to an information bit. For example, cyclic factor Q is 360 in the DVB-T2 and the like (Q=360).

An example of bit interleaver 120 in FIG. 1 will be described below with reference to FIG. 3. For example, PTL 5 discloses a parallel bit interleaver similar to the parallel bit interleaver included in the bit interleaver of FIG. 3.

Bit interleaver 120 includes parallel bit interleaver 121 particularly suitable for the structure of the QC LDPC code. In FIG. 3, the QC LDPC codeword has 12 cyclic blocks per codeword and 8 bits (Q=8) per cyclic block. The number of cyclic blocks per codeword is written as "N".

For convenience, in (DISCUSSION BY THE INVENTORS AND KNOWLEDGE OBTAINED BY INVENTORS), the case that N cyclic blocks of one QC LDPC codeword are grouped into sections each of which included the identical number of cyclic blocks, namely, the case that N is a multiple of M will be described below. It is assumed that Q is a multiple of 2. For example, Q=360 is obtained in the DVB-T2.

The plurality of cyclic blocks of one QC LDPC codeword are grouped into the plurality of sections, and each section is separately interleaved using a section permutation. The number of cyclic blocks per section is a parameter of parallel bit interleaver 121, and the number of cyclic blocks per section is written as "M". M=4 is obtained in the example of FIG. 3.

Figure 3:
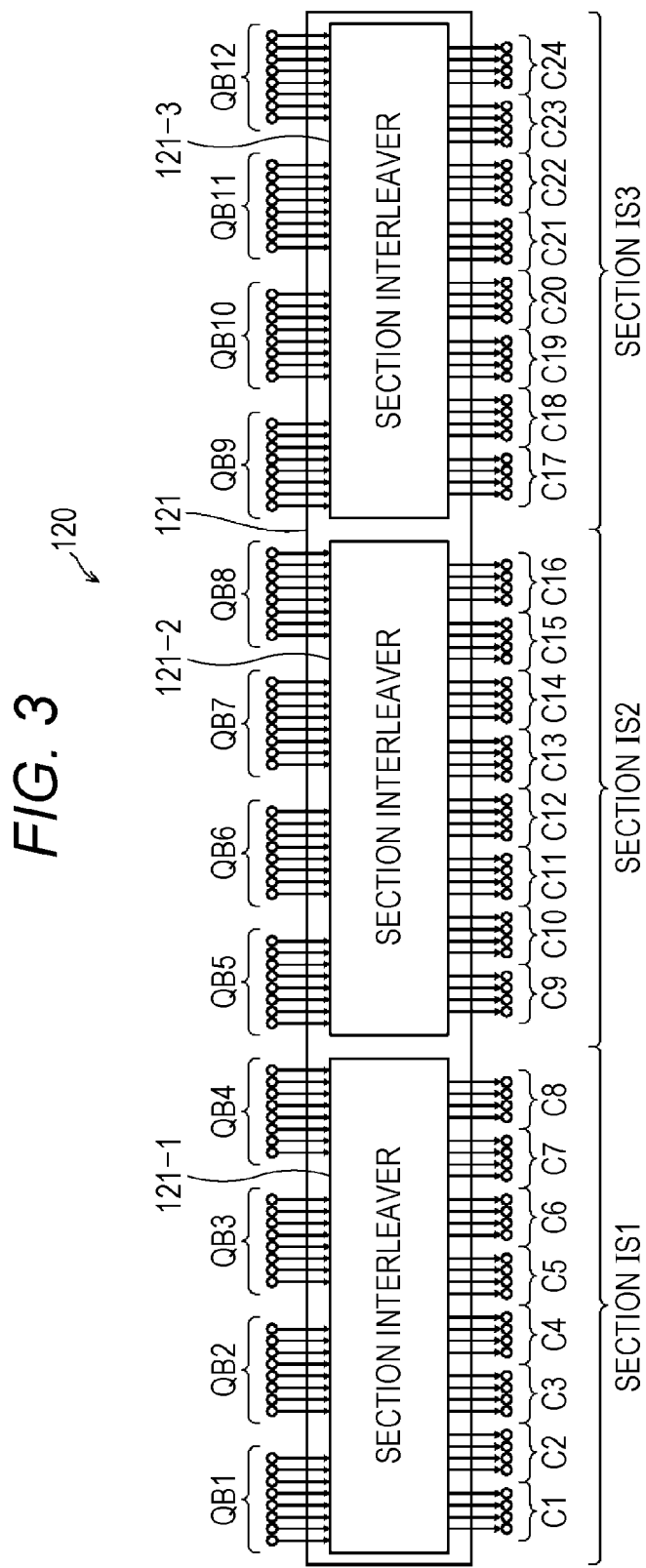
FIG. 3 is a block diagram illustrating a configuration example of a bit interleaver in FIG. 1.

In the example of FIG. 3, 12 (=N) cyclic blocks QB1 to QB12 of the QC LDPC codeword are grouped into 3 (=N/M=12/4) sections IS1 to IS3. 32 (=Q×M=8×4) bits of sections IS1 to IS3 are separately interleaved using the section permutation by section interleavers 121-1 to 121-3 of parallel bit interleaver 121. The interleaving is performed such that 1 bit of each of 4 (=M) cyclic blocks included in the corresponding section is mapped in 4 (=M) bits of each of constellation groups C1 to C24.

An example of the section permutation performed on section IS1 in FIG. 3 by section interleaver 121-1 for M=4 and Q=8 will be described with reference to FIG. 4.

Figure 4:
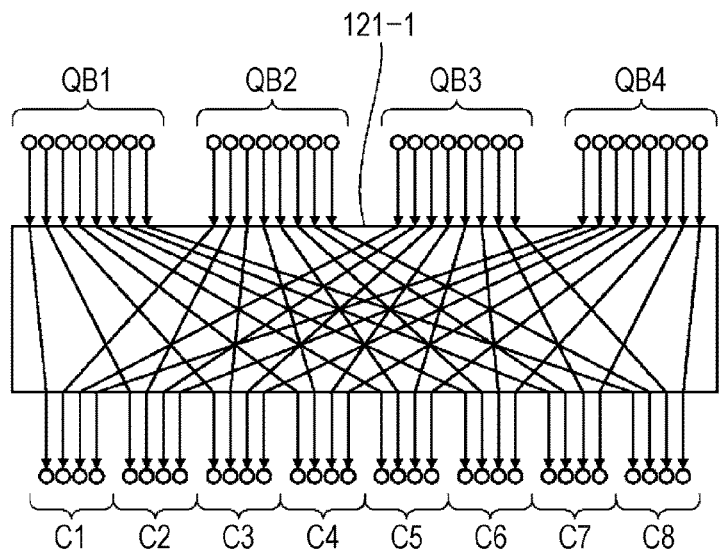
FIG. 4 is a view illustrating an example of a section permutation by a section interleaver in FIG. 3.

As illustrated in FIG. 4, section interleaver 121-1 interleaves 32 (=Q×M=8×4) bits of cyclic blocks QB1 to QB4 such that the 32 bits are mapped in 8 constellation groups C1 to C8 (Q=8) each of which includes 4 (=M) bits.

The example of the section permutation performed on section IS1 in FIG. 3 by section interleaver 121-1 for M=4 and Q=8 will be described in detail with reference to FIGS. 5A and 5B. One square in FIGS. 5A and 5B corresponds to one bit of the codeword.

Section interleaver 121-1 performs processing equivalent to the following processing.

Figure 5A:
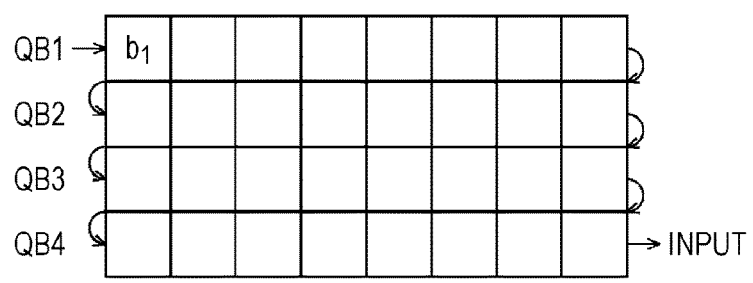
FIG. 5A is a view illustrating an example of processing of writing a plurality of bits of a codeword in an interleaver matrix.

As illustrated in FIG. 5A, section interleaver 121-1 writes 32 (=Q×M=8×4) bits of section IS1 in a interleaver matrix of M rows and Q columns (i.e., a matrix of four rows and eight columns) in a row direction (row by row) in order of the input bit. As illustrated in FIG. 5B, section interleaver 121-1 reads the written 32 (=Q×M=8×4) bits from the interleaver matrix in a column direction (column by column), and outputs the 32 bits in the reading order. In FIGS. 5A and 5B, the writing order and reading order are indicated by arrows.

Figure 5B:
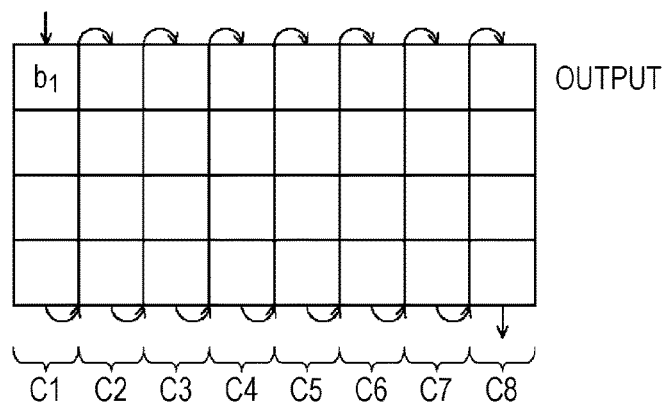
FIG. 5B is a view illustrating an example of processing of reading the plurality of bits of the codeword from the interleaver matrix.

The contents of the section permutation in FIGS. 4, 5A, and 5B can be applied to the section permutations by section interleavers 121-2 and 121-3.

When the section permutation is performed, the output of each of section interleavers 121-1 to 121-3 includes 8 (=Q) constellation groups each of which includes 4 (=M) bits (the bits of one column in the interleaver matrix), and 4 (=M) bits of each constellation group belong to 4 (=M) different cyclic blocks of the original LDPC block.

Preferably M is the number of bits that are a basis of D PAM symbols of the D-dimensional vector (D-dimensional constellation block), for example, M=B×D.

The parallel bit interleaver in FIG. 3 includes a section interleaver in each of the plurality of sections. Alternatively, the parallel bit interleaver may include section interleavers, in which the number is less than the number of sections, and separately perform the section permutation on the plurality of sections using the own section interleaver in a time-division manner.

Before the plurality of cyclic blocks are grouped into the plurality of sections, the arrangement order of the plurality of cyclic blocks in the QC LDPC codeword may be changed based on a predetermined permutation. The permutation is referred to as cyclic block permutation (QB permutation).

In each cyclic block, the arrangement order of the Q bits may be changed using a predetermined permutation rule. The permutation is referred to as intra-cyclic block permutation (intra-QB permutation), and a cyclic shift is usually used in the intra-QB permutation. Although usually a shift value depends on each cyclic block, the equal shift value may be used in at least some cyclic blocks.

Figure 6:
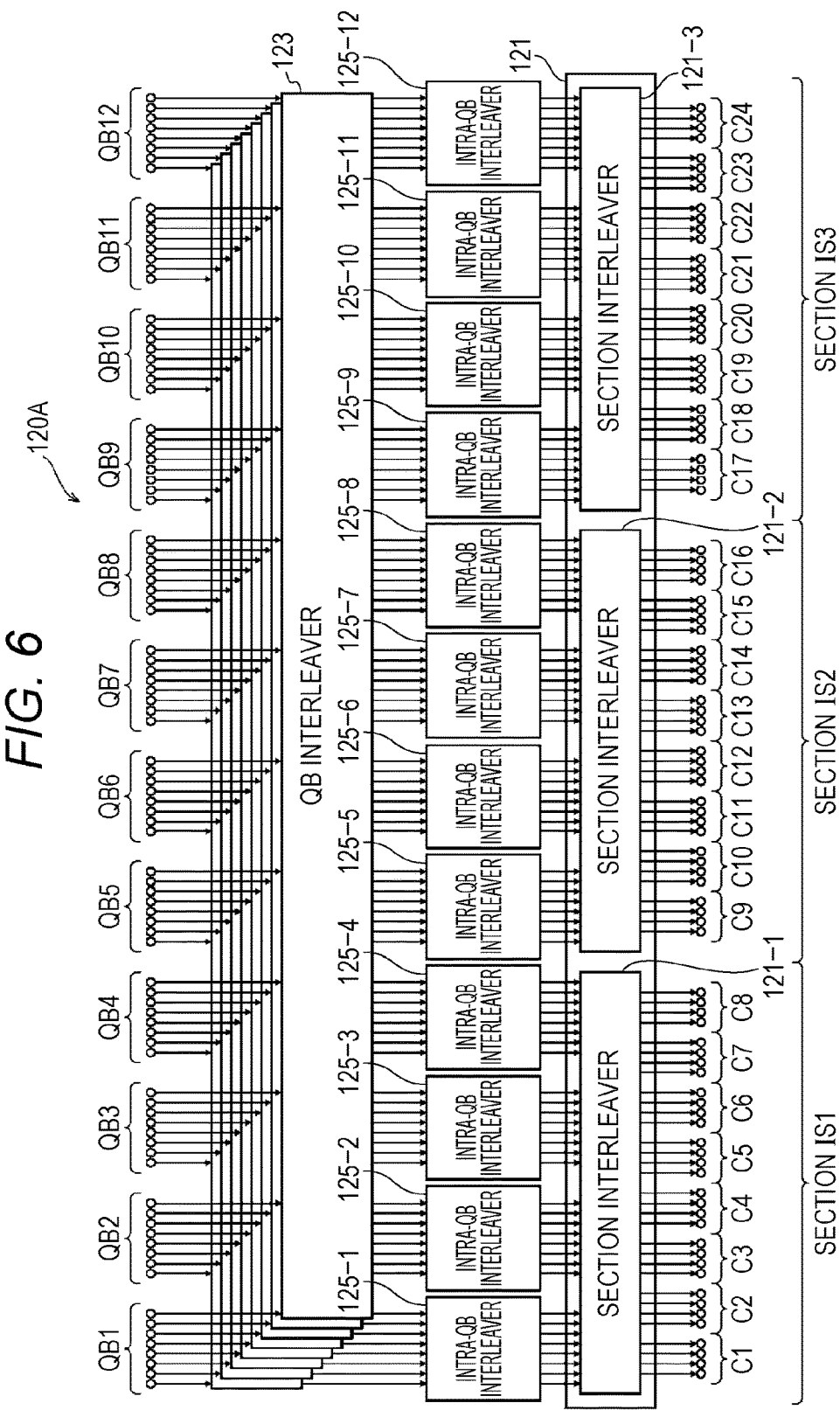
FIG. 6 is a block diagram illustrating another configuration example of the bit interleaver in FIG. 1.

FIG. 6 is a block diagram illustrating a configuration example of a bit interleaver having a QB permutation function and an intra-QB permutation function.

In addition to section interleaver 121 that performs the section permutation, bit interleaver 120A includes QB interleaver 123 that performs the QB permutation and intra-QB interleavers 125-1 to 125-12 that perform the intra-QB permutation at a preceding stage of section interleaver 121.

Any one of the QB permutation and the intra-QB permutation may be performed, and the performing order of the QB permutation and the intra-QB permutation may be inversed.

The bit interleaver in FIG. 6 includes the intra-QB interleaver in each of the plurality of cyclic blocks. Alternatively, the bit interleaver may include intra-QB interleavers, in which the number is less than the number of sections, and separately perform the intra-QB permutation on the plurality of cyclic blocks using the own intra-QB interleaver in the time-division manner.

Although the QB permutation and the intra-QB permutation are necessary for optimization of communication performance, the QB permutation and the intra-QB permutation are not directly associated with the present disclosure. Actually, the QB permutation and the intra-QB permutation can be considered to be a part of the definition of the QC LDPC code.

The QB permutation is equivalent to the permutation of the column (in FIG. 2, one column of the cyclic block corresponds to eight columns of the matrix element) of the cyclic block in the original PCM. The cyclic shift in the intra-QB permutation is equivalent to the further cyclic shift of the cyclically shifted diagonal in the PCM by (q mod Q). Where q is the shift value when Q bits are circulated in the intra-QB permutation. The equal shift value is applied to all the diagonals of all the cyclic blocks in the identical column of the PCM.

The rotation constellation in the D-dimensional space by constellation rotator 150 in FIG. 1 will be described below.

The rotation constellation is an effective tool to improve robustness of the communication system in a transmission passage associated with deep fading or disappearance. A basic view of the rotation constellation is to make diversity of a signal space by simultaneously transmitting one piece of binary information using the plurality of components.

Constellation rotator 150 performs the following processing in order to make the diversity of the signal space.

Constellation rotator 150 groups (D×Q) PAM symbols, which are output from each section of component deinterleaver 140, into D consecutively-output PAM symbols. Constellation rotator 150 multiples the square orthogonal matrix of D rows and D columns by the D-dimensional vector in which the D PAM symbols are set to each dimensional value in each group (rotation processing). That is, assuming that $V_D$ is the D-dimensional vector multiplied by the square orthogonal matrix, that $M_{D,D}$ is the square orthogonal matrix of D rows and D columns, and that $V'_D$ is the D-dimensional vector (D-dimensional rotation vector) obtained by the multiplication, constellation rotator 150 calculates $V'_D = M_{D,D} V_D$. For example, for M=B×D, the D-dimensional vector is made from M bits for one column of the interleaver matrix of the section interleaver in the bit interleaver.

Preferably D is a power of 2, for example, 2 or 4.

The square orthogonal matrix of D rows and D columns is a matrix in which each dimensional value of the D-dimensional vector is dispersed in at least two dimensional values of the D-dimensional rotation vector.

A matrix, in which absolute values of all elements located on a main diagonal are equal to real value a while absolute values of all elements that are not located on a main diagonal are equal to real value b that is not zero, can be cited as an example of the orthogonal matrix. As used herein, the main diagonal means a diagonal including i rows and i columns (i=1 to D). A matrix in which the rows are rearranged, a matrix in which the columns are rearranged, and a matrix in which both the rows and columns are rearranged can be used as the orthogonal matrix.

It is necessary for component interleaver 160 in FIG. 1 to guarantee that (1) the D rotation PAM symbols (rotation components) of the D-dimensional rotation constellation block are evenly dispersed as much as possible in a interleaving period, and (2) that, for the time-frequency slicing (TFS), the D rotation PAM symbols of the D-dimensional rotation constellation block are mapped in all the possible RF channels. Unless both the conditions (1) and (2) are satisfied, desirably the condition (2) is guaranteed while the condition (1) is sacrificed.

Examples of component deinterleaver 140, component interleaver 160, and cell interleaver 170 in FIG. 1 will be described below.

Component interleaver 160 performs component interleaving equivalent to the following processing on each section having a one-on-one correspondence relation with the section of bit interleaver 120.

Component interleaver 160 writes the (D×Q) rotation components, in the column direction, in the interleaver matrix of D rows and Q columns with the rotation PAM symbol as the rotation component in the output order of the rotation PAM symbol of constellation rotator 150. The D rotation components of one column in the interleaver matrix are included in the identical one D-dimensional rotation constellation block.

Component interleaver 160 cyclically shifts each row of the interleaver matrix. At this point, the shift value in a first row of the interleaver matrix is set to 0, and the cyclic shift, in which the shift value is increased by Q/DPAM symbols compared with the cyclic shift applied to the preceding row, is applied to each row of the interleaver matrix.

Component interleaver 160 reads the rotation component in the row direction from the post-cyclic-shift interleaver matrix, and outputs the rotation component in the reading order. The two consecutively-output rotation components are mapped in one cell having a real component and an imaginary component, and sequentially supplied to cell interleaver 170. The D rotation components of the post-component-interleaving D-dimensional rotation constellation block are evenly spread through the component interleaving.

Cell interleaver 170 writes ((N/M)×D×(Q/2)) cells, in the column direction, in the interleaver matrix of ((N/M)×D) rows and (Q/2) columns in the row direction in the input order, reads the cells from the interleaver matrix, and performs cell interleaving equivalent to outputting the cells in the reading order.

The operation of the component deinterleaver 140 with respect to the component interleaver 160 will be described below.

Component deinterleaver 140 performs component deinterleaving equivalent to the following processing on each section having the one-on-one correspondence relation with the section of bit interleaver 120.

Component deinterleaver 140 writes the (D×Q) components, in the column direction, in the interleaver matrix of D rows and Q columns with the PAM symbol as the component in the output order of the PAM symbol of PAM mapper 130.

Component deinterleaver 140 cyclically shifts each row of the interleaver matrix. At this point, the shift value in the first row of the interleaver matrix is set to 0, and the cyclic shift, in which the shift value is decreased by the Q/DPAM symbols compared with the cyclic shift applied to the preceding row, is applied to each row of the interleaver matrix. Thus, the cyclic shift performed by the component deinterleaver 140 and the cyclic shift performed by the component interleaver 160 are directly opposite to each other.

Component deinterleaver 140 reads the components in the column direction from the post-cyclic-shift interleaver matrix, and outputs the components in the reading order.

Component deinterleaver 140 or component interleaver 160 may include an interleaver in each section to perform the component deinterleaving or the component interleaving.

Component deinterleaver 140 or component interleaver 160 may include interleavers fewer than the number of sections, and separately perform the component deinterleaving or the component interleaving the plurality of sections using the interleavers in the time-division manner.

The time-frequency slicing (TFS) will be described below.

The TFS, in which diversity (hereinafter, appropriately referred to as "channel diversity") is effectively utilized with a plurality of RF channels, is an effective tool to improve the robustness of the communication system in the transmission passage associated with the deep fading or disappearance.

There is frequency diversity as a main type of the channel diversity. The frequency diversity originates from the fact that a fading correlation between any two RF channels is relatively low because the fading in a radio channel has a tendency to have frequency selectivity. In the case that transmitters in which different RF channels are used are disposed at different geographic positions, what is called spatial diversity is utilized. Accordingly, the channel diversity originates from both the frequency diversity and the spatial diversity.

In the communication system in which the plurality of RF channels are used, in order to enable the reception with one tuner of the receiver, it is necessary that the consecutively-received information, for example, one broadcasting program be transmitted through not the plurality of RF channels but one RF channel. Therefore, it is necessary to use frequency switching and a time slicing sequence, namely, a TFS scheduling (a time-frequency slicing schedule). Based on the TFS scheduling, the receiver can extract desired data from each RF channel in a proper slicing period while switching the RF channel between the plurality of RF channels. The receiver is usually notified of the TFS scheduling (time-frequency arrangement) using dedicated signaling information.

Figure 7:
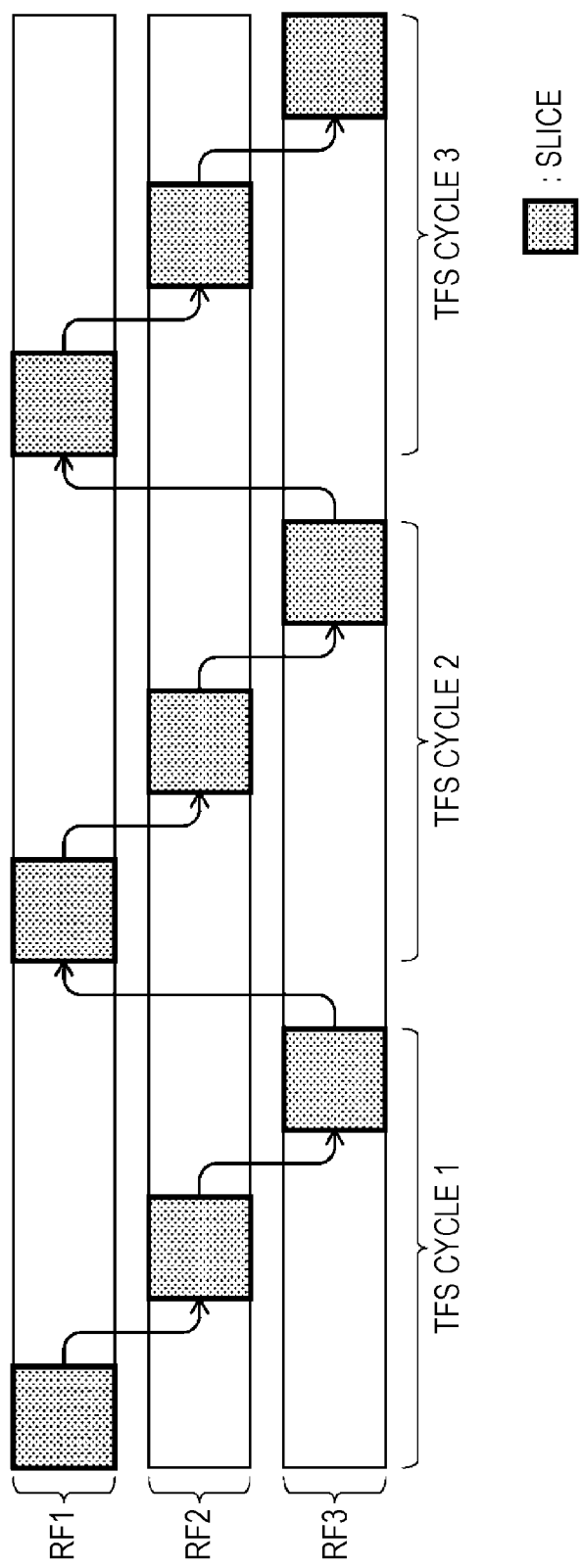
FIG. 7 is a view illustrating an example of the time-frequency slicing.

FIG. 7 illustrates an example of the TFS scheduling. At this point, the number of RF channels is 3 and the number of TFS cycles is 3. In the example of FIG. 7, 9 slices are sequentially arranged in the RF channel while the order of RF channels RF1, RF2, and RF3 is repeated. It is necessary to insert a guard period between the two consecutive slices in order that a tuner of the receiver can receive the slice while switching between the RF channels.

Hereinafter, the number of RF channels in TFS multiplexing is written as $N_{RF}$, and the number of TFS cycles in each of which one LDPC block is dispersed is written as $N_C$. Assuming that $N_S$ is the number of slices in each of which one FEC block is dispersed, $N_S = N_{RF} \times N_C$ is obtained.

The optimum diversity is achieved in the case that each LDPC block has the identical number of cells in all the slices having an identical length.

Figure 8:
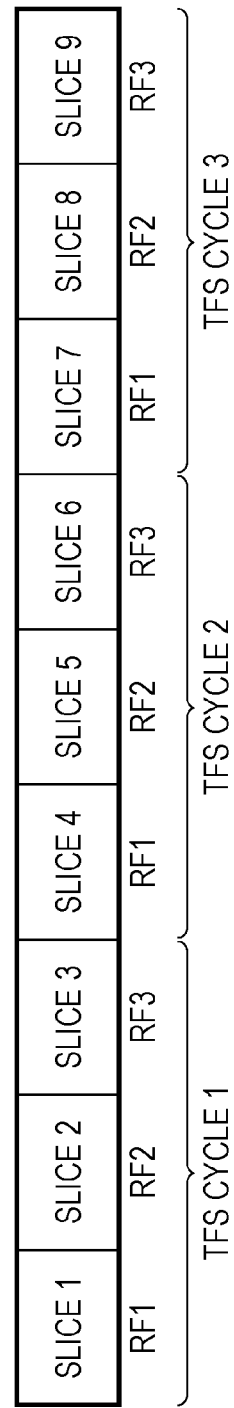
FIG. 8 is a view illustrating an example of slicing of one codeword.

FIG. 8 illustrates an example of the slicing of the FEC block. At this point, the number of RF channels is 3, the number of TFS cycles is 3, and the example of FIG. 8 corresponds to the example of the TFS scheduling in FIG. 7. The slicing processing is simple. In the example of FIG. 8, scheduler 180 slices the plurality of cells output from cell interleaver 170 into 9 ($=N_S=N_{RF}\times N_C=3\times3$) slices such that the consecutively-output cells are included in the identical slice.

In the case that the rotation constellation is used together with the TFS, it is necessary to evenly map the D rotation PAM symbols (rotation component) of the D-dimensional rotation constellation block in the RF channel as much as possible. For example, for D=2, it is necessary to map the two rotation components of the two-dimensional rotation constellation block in all possible pairs of the RF channel. For example, in the case that the number of RF channels is 3, assuming that 1, 2, and 3 are indexes of the RF channel, the pairs of the RF channel are (1,2), (1,3), and (2,3). It is necessary to avoid mapping the two components of the two-dimensional rotation constellation block in the identical RF channel.

The problem in the case that constellation rotator 150, component interleaver 160, and cell interleaver 170 are used in the TFS will be described below with reference to the drawings.

Figure 9:
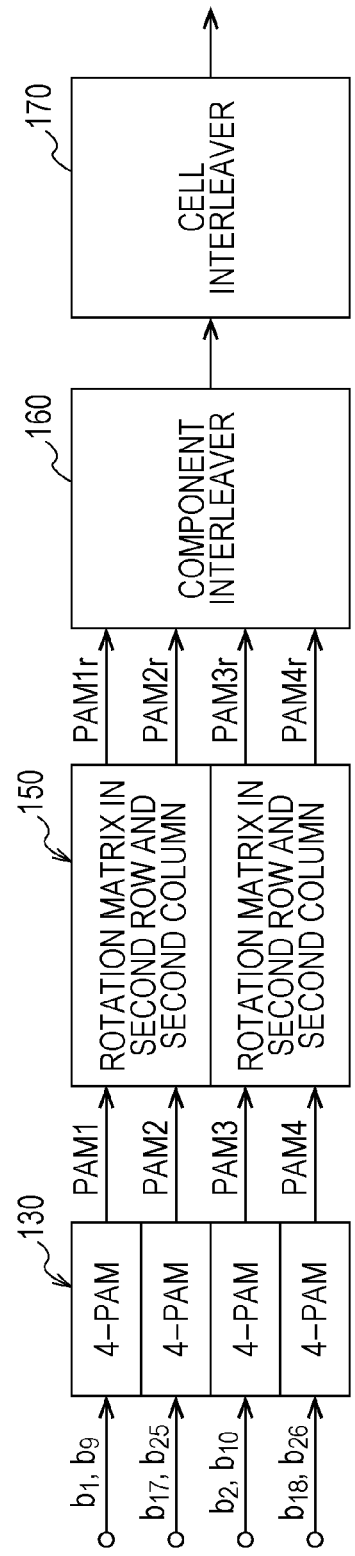
FIG. 9 is a block diagram illustrating a part of the configuration of the transmitter in FIG. 1.

FIG. 9 is a block diagram illustrating a part of the configuration of the transmitter in FIG. 1, and PAM mapper 130, constellation rotator 150, component interleaver 160, and cell interleaver 170 are illustrated in FIG. 9. Where D=2 and B=2. In FIG. 1, component deinterleaver 140 is disposed between PAM mapper 130 and constellation rotator 150. However, because component deinterleaver 140 has no particular relationship in the description about the problem in the case that the units are used in the TFS, component deinterleaver 140 is eliminated in FIG. 9 for the simple description.

FIG. 10 illustrates a bit arrangement in the bit interleaver at a preceding stage of PAM mapper 130. At this point, the bit arrangement of FIG. 10 corresponds to bit interleaver 120 in FIGS. 3 to 5, and N=12, Q=8, and M=D×B=2×2=4. One square in FIG. 10 corresponds to one bit, and the index of b in the square indicates the input order.

In the bit arrangement of FIG. 10, four bits of each row in sections IS1 to IS3 is a bit group which is a basis of one two-dimensional rotation constellation block.

PAM mapper 130 sequentially maps consecutive 2 (=B) bits (b1,b9), (b17,b25), (b2,b10), (b18,b26), . . . output from section interleavers 121-1 to 121-3 in PAM symbols PAM1, PAM2, PAM3, PAM4, . . . , and outputs the mapped 2 (=B) bits (b1,b9), (b17,b25), (b2,b10), (b18,b26), . . . .

Constellation rotator 150 sequentially performs next processing on each group including consecutive 4 ($=2\times D=2\times2$) PAM symbols. The group including consecutive 4 (=D) PAM symbols PAM1, PAM2, PAM3, and PAM4 will be described below. Constellation rotator 150 multiplies the square orthogonal matrix of two rows and two columns (=a matrix of D rows and D columns) by the two-dimensional vectors (PAM1 and PAM2), and sequentially outputs rotation PAM symbols PAM1r and PAM2r of the resultant two-dimensional rotation vectors (first rotation processing). Then, constellation rotator 150 multiplies the square orthogonal matrix of two rows and two columns (=a matrix of D rows and D columns) by the two-dimensional vectors (PAM3 and PAM4), and sequentially outputs rotation PAM symbols PAM3r and PAM4r of the resultant two-dimensional rotation vectors (second rotation processing). The similar processing is performed in each group.

Component interleaver 160 performs the following processing on each section having a one-on-one correspondence relation with sections IS1 to IS3 of bit interleaver 120. Component interleaver 160 writes the (D×Q) rotation components, in the column direction, in the interleaver matrix of two rows and eight columns (D rows and Q columns) with the rotation PAM symbol as the rotation component in the output order of the rotation PAM symbol of constellation rotator 150. As a result, the arrangement of the rotation components in component interleaver 160 is obtained as illustrated in FIG. 11A. One square in FIGS. 11A and 11B corresponds to one rotation component, and a numerical character in the square indicates the input order of the rotation component. The hatched rotation component is transmitted later in the form of the real component of the cell, and the non-hatched component is transmitted later in the form of the imaginary component of the cell.

Component interleaver 160 performs the cyclic shift for 4 ($=Q/D=8/2$) rotation components on the second (=D) row in each of sections IS1 to IS3. FIG. 11B illustrates the result. In FIG. 11B, the rotation component in FIG. 11A arranged in the first column of each of sections IS1 to IS3 is hatched.

Component interleaver 160 reads the rotation components in the row direction from the post-cyclic-shift interleaver matrix of two rows and eight columns (=a matrix of D rows and Q columns), and outputs the rotation components in the reading order. The two consecutively-output rotation components are mapped in one cell having a real component and an imaginary component, and sequentially supplied to cell interleaver 170.

Cell interleaver 170 writes 24 ($=D\times(Q/2)\times(N/M)=2\times(8/2)\times(12/4)$) cells in the interleaver matrix of six rows and four columns ($((N/M)\times D)$ rows and (Q/2) columns=$((12/4)\times2)$ rows and (8/2) columns) in the row direction in the input order, reads the cells in the column direction from the interleaver matrix, and outputs the cells in the reading order. During the writing in cell interleaver 170, the cells are arranged as illustrated in FIG. 12. One square in FIG. 12 corresponds to one cell, and the numerical character in the square indicates the cell input order. The two cells, in which the two rotation components hatched in FIG. 11B are set to the real components, are indicated by the identical hatch in order to facilitate the problem to be described. That is, for example, cells 1 and 7 in which two rotation components 1 and 2 of the two-dimensional rotation constellation block are set to the real component are indicated by the hatch identical to that of rotation components 1 and 2.

Figure 13:
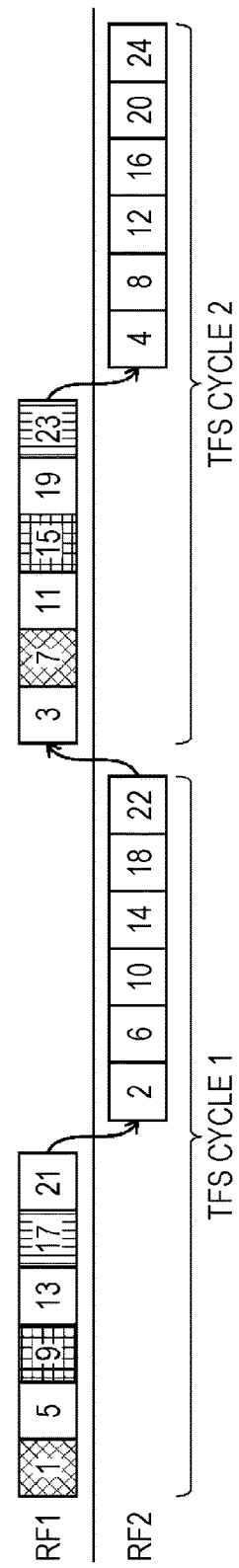
FIG. 13 is a view illustrating a state of the time-frequency slicing in two TFS cycles with two frequency channels with respect to the cell arrangement in FIG. 12.

For example, for the TFS ($N_{RF}=N_C=2$) having the 2 RF channels and the 2 TFS cycles, scheduler 180 groups 24 ($=(N/M)\times D\times(Q/2)=(12/4)\times2\times(8/2)$) cells into 4 ($=N_{RF}\times N_C=2\times2$) slices such that each of the 24 cells includes 6 ($=(N/M)\times D\times(Q/2)/(N_{RF}\times N_C)=24/(2\times2)$) cells consecutively cells output from cell interleaver 170. Scheduler 180 allocates the 4 ($=N_{RF}\times N_C=2\times2$) slices to the RF channels while sequentially repeating RF channels RF1 and RF2. FIG. 13 illustrates the allocation result. FIG. 13 corresponds to FIG. 12.

For example, the real components of the cells 1 and 7 corresponding to the two rotation PAM symbols (rotation components) of the one two-dimensional rotation constellation block are transmitted through identical RF channel RF1. When RF channel RF1 is affected by the deep fading, the two rotation PAM symbols of the two-dimensional rotation constellation block is lost, namely, the whole two-dimensional rotation constellation block is lost.

Thus, for the TFS, the D rotation PAM symbols of the D-dimensional rotation constellation block are mapped in the identical RF channel depending on a combination of parameters D, $N_{RF}$, and $N_C$, and sometimes the D-dimensional rotation constellation block is lost.

Accordingly, it is necessary that the D rotation PAM symbols of the D-dimensional rotation constellation be dispersed on RF channels as many as possible.

The inventors discussed how the rotation PAM symbols of the D-dimensional rotation constellation block are disposed on RF channels as many as possible.

At this point, the inventors replaced the components of the consecutive two columns of the identical row in FIGS. 11A and 11B with one cell having the real component and the imaginary component. In this case, FIG. 14A illustrates the arrangement of the cells during the writing of the component interleaver corresponding to FIG. 11A, and FIG. 14B illustrates the post-cyclic-shift arrangement of the cells during the writing of the component interleaver corresponding to FIG. 11B. In each of sections IS1 to IS3, the cyclic shift value of the first row is 0, and the cyclic shift value of the second row is 2 (=(Q/2)/D=(8/2)/2) cells.

As can be seen from FIG. 14A, a value (unit cell) ranging from 0 to 3 (=Q/2−1=8/2−1), namely, 1 cell, 2 cells, and 3 cells can be taken as the cyclic shift value of the second row in each of sections IS1 to IS3. As can be seen from FIG. 14B, in the cyclic shift value of 2 (=(Q/2)/D=(8/2)/2) cells, all the rotation components of the two-dimensional rotation constellation block are arranged in the identical RF channel.

Figure 15:
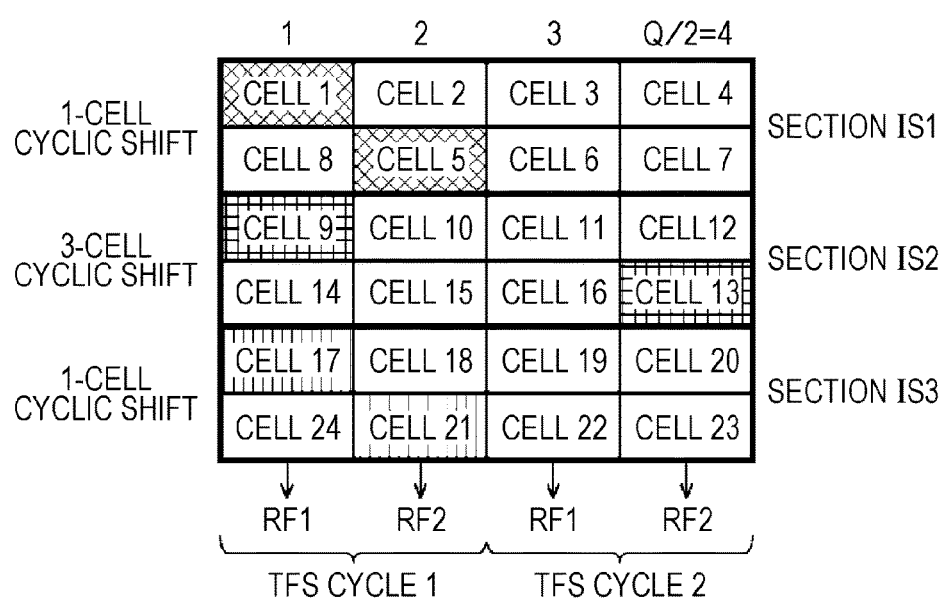
FIG. 15 is a view illustrating another example of the post-cyclic shift cell arrangement corresponding to the cell arrangement in FIG. 14A.
Figure 16:
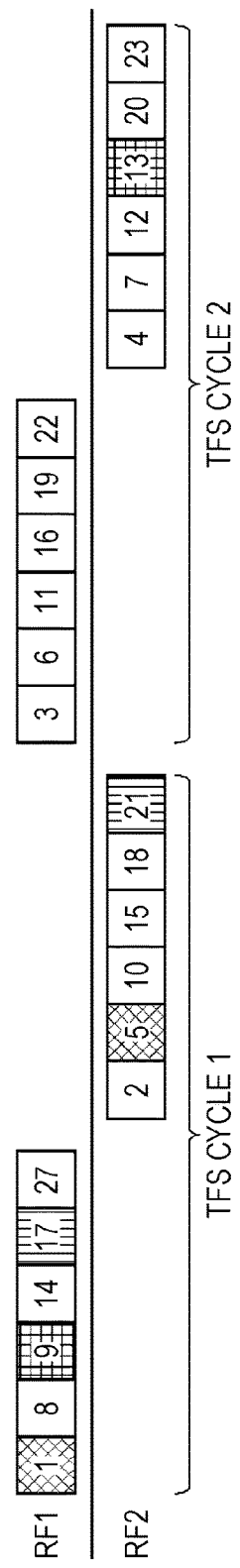
FIG. 16 is a view illustrating an example of a state of the time-frequency slicing in two TFS cycles with two frequency channels with respect to the cell arrangement in FIG. 15.

It is assumed that the cyclic shift value of the second row in each of sections IS1 to IS3 is selected from the cyclic shift values of 1 cell and 3 cells in which 1 cell is excluded. In the example of FIG. 15, the cyclic shift value is 1 cell in section IS1, 3 cell in section IS2, and 3 cell in section IS3. FIG. 16 illustrates the TFS result, and the two rotation components of the two-dimensional rotation constellation block are dispersed on different RF channels. For example, the real components of the cells 1 and 5 corresponding to the two rotation components of the one two-dimensional rotation constellation block are transmitted through RF channels RF1 and RF2, respectively. Accordingly, even if one RF channel is affected by the deep fading, the two-dimensional rotation constellation block is sufficiently decoded by the other RF channel.

As a result of the discussion, the inventors found that the D rotation components of the D-dimensional rotation constellation block can be arranged in RF channels as many as possible by properly selecting the cyclic shift value.

For example, in the case that component interleaver 160 cyclically shifts the interleaver matrix of D rows and Q columns in FIG. 11A, a value ranging from 0 to Q−1 can be taken as the cyclic shift value. Component interleaver 160 performs the cyclic shift using the cyclic shift value selected for each row such that the D rotation PAM symbols of the D-dimensional rotation block are evenly dispersed in the FEC blocks as much as possible. Preferably the cyclic shift value is a particle size of the cell, namely a multiple of 2.

Exemplary Embodiment

A transmitter according to an exemplary embodiment of the present disclosure will be described below with reference to the drawings.

FIG. 17 is a block diagram illustrating a configuration example of the transmitter according to the exemplary embodiment of the present disclosure.

Transmitter 100A in FIG. 17 has a configuration, in which component deinterleaver 140 of conventional transmitter 100 in FIG. 1 is replaced with component deinterleaver 140A while component interleaver 160 and cell interleaver 170 are replaced with component interleaver 160A. In transmitter 100A of FIG. 17, the component having the function or operation substantially identical to those of transmitter 100 in FIG. 1 is designated by the identical reference mark, and the description is omitted.

In the description of (EXEMPLARY EMBODIMENT), it is assumed that the number of cyclic blocks N of one LDPC block is a multiple of the number of cyclic blocks M included in one section, and that D is a power of 2 (for example, 2 and 4), namely, M=B×D.

Component interleaver 160A writes the (D×Q) rotation components, in the column direction, in the interleaver matrix of D rows and Q columns with the rotation PAM symbol as the rotation component in the input order of the rotation PAM symbol of constellation rotator 150 in each section having the one-on-one correspondence relation with (N/M) sections of bit interleaver 120.

Component interleaver 160A converts the interleaver matrix in which, in each section, the rotation components (rotation PAM symbols) of the real values of the two columns adjacent to each other in the identical row of the interleaver matrix of D rows and Q columns are used as one cell having the real component and the imaginary component into the interleaver matrix (hereinafter, referred to as a "complex interleaver matrix") of D rows and (Q/2) columns in which the component (cell) of the complex value is used as the element.

Component interleaver 160A arranges N/M complex interleaver matrices in the Dth row and the (Q/2)th column in the column direction (such that an initial row of another complex interleaver matrix is arranged next to a final row of a certain complex interleaver matrix). Thus, the complex interleaver matrix (hereinafter, referred to as a "combined complex interleaver matrix") of ((N/M)×D) rows and (Q/2) columns is formed by combining the N/M complex interleaver matrices in the Dth row and the (Q/2) the column.

Component interleaver 160A cyclically shifts each row of the combined complex interleaver matrix. The cyclic shift performed by component interleaver 160A is described in detail later.

Component interleaver 160A reads the cell in the column direction from the post-cyclic-shift combined complex interleaver matrix, and outputs the cell in the reading order.

Scheduler 180 divides ((N/M)×D×(Q/2)) cells output from component interleaver 160A into ($N_{RF}$×$N_C$) slices. Scheduler 180 sequentially arranges the ($N_{RF}$×$N_C$) slices in the RF channels while repeating $N_{RF}$ RF channels RF1, RF2, RF3, . . . .

At this point, the number of TFS cycles $N_C$ is the number of changes between the $N_{RF}$ RF channels in the case that one codeword is transmitted. All the RF channels are scanned once (for $N_{RF}$=3, RF1→RF2→RF3) for $N_C$=1, and all the RF channels are scanned twice (for $N_{RF}$=3, RF1→RF2→RF3→RF1→RF2→RF3) for $N_C$=2.

Component deinterleaver 140A performs the following processing on each section having the one-on-one correspondence relation with (N/M) sections of bit interleaver 120.

Component deinterleaver 140A writes the (D×Q) components in the column direction in the interleaver matrix of D rows and Q columns with the PAM symbol as the component in the input order of the PAM symbol of PAM mapper 130.

Component deinterleaver 140A performs the cyclic shift on each section of the interleaver matrix of D rows and Q columns using a value in which the shift value in units of cells used as the row in the cyclic shift by component interleaver 160A is multiplied by (−1)×2 as a shift value in units of PAM symbols.

In the case that the real-value interleaver matrix of D rows and Q columns is considered to be the complex-value interleaver matrix of D rows and (Q/2) columns while the PAM symbols (the components of the real values) of the consecutive two columns in the identical row are used as one complex-value component (cell) of the complex-value, the cyclic shift processing is equivalent to the following cyclic shift. Component deinterleaver 140A performs the cyclic shift on each section of the interleaver matrix of D rows and (Q/2) columns using a value in which the shift value used as the row in the cyclic shift by component interleaver 160A is multiplied by (−1) as a shift value in units of cells.

Component deinterleaver 140A reads the components in the column direction from the post-cyclic-shift interleaver matrix of D rows and Q columns, and outputs the components in the reading order.

The cyclic shift performed in the combined complex interleaver matrix by component interleaver 160A will be described below. In this case, the shift value of the cyclic shift is described using a complex QAM symbol (the cell of the complex value) instead of the PAM symbol of the real value.

Component interleaver 160A performs the cyclic shift in units of W (=floor(Q/max{D,($N_{RF} \times N_C$)}/2)) cells. Where W is a cyclic shift width. The function floor(x) is a function that returns a maximum integer of x or less.

A set of all the possible cyclic shift values is {0, W, 2×W, . . . , (max{D,($N_{RF} \times N_C$)}−1)×W}.

However, depending on the combination of the parameters, a slice width of the final slice differs from a slice width of another slice. This is generated in the case that Q/2 is not a divisor of $N_{RF} \times N_C$ but (for example, Q=360 and $N_{RF}=N_C=4$). In such cases, for example, a column width of the combined complex interleaver matrix for all the slices except for the final slice is floor{Q/($N_{RF} \times N_C$)/2} cells. The column width of the combined complex interleaver matrix for the final slice is ([Q/2−($N_{RF} \times N_C$−2)×floor{Q/($N_{RF} \times N_C$)/2}]/2) cells. The description can be used even in the case that $N_{RF} \times N_C$ is a divisor of Q/2.

How to select the cyclic shift value actually used by component interleaver 160A from the set {0, W, 2×W, . . . , (max{D,($N_{RF} \times N_C$)}−1)×W} of all the possible cyclic shift values will be described below.

Because the cyclic shift value is written as k×W (k=0 to max{D,($N_{RF} \times N_C$)}−1), for convenience, how to select the cyclic shift value actually used by component interleaver 160A from the set {0, W, 2×W, . . . , (max{D,($N_{RF} \times N_C$)}−1)×W} of all the possible cyclic shift values will be described while replaced with how to select a factor k of W from the set {0, 1, 2, . . . , max{D,($N_{RF} \times N_C$)}−1.

In the Dth column corresponding to one section of the combined complex interleaver matrix, D k values are selected from integers ranging from 0 to (max{D,($N_{RF} \times N_C$)}−1) as the set (hereinafter, referred to as a "section usage set") of the factor k of W applied to each of the cyclic shifts from the leading row to the final column, such that for $N_{RF} \geq D$, the number of different integral values obtained by k mod $N_{RF}$ becomes a range of 2 to D, such that for $N_{RF} < D$ and $N_{RF} \times N_C \geq D$, the number of different integral values obtained by k mod $N_{RF}$ becomes a range of 2 to $N_{RF}$, such that for $N_{RF} < D$, $N_{RF} \times N_C < D$, and $a \times N_C \neq b \times D$, the number of different integral values obtained by k mod D becomes a range of 2 to D, and such that for $N_{RF} < D$, $N_{RF} \times N_C < D$, and $a \times N_C = b \times D$, the number of different integral values obtained by k mod D becomes a range of 2 to D and a difference between at least two k values includes a value that is not a multiple of a/b. The D k values of the section usage set may include the identical k value, or the different k values having the different values of k mod $N_{RF}$ or k mod D such that, for example, {0,0,1,$N_{RF}$} becomes the section usage set for D=4.

Component interleaver 160A performs the cyclic shift on each of the D columns using a product (unit cell) of W and the factor value of W applied to the row as the cyclic shift value.

In the case that the number of different integral values obtained by k mod $N_{RF}$ is 2, the D-dimensional rotation constellation block is transmitted using the two RF channels. In the case that the number of different integral values obtained by k mod $N_{RF}$ is D for $N_{RF} \geq D$, the D-dimensional rotation constellation block is transmitted using D RF channels. In the case that the number of different integral values obtained by k mod $N_{RF}$ is $N_{RF}$ for $N_{RF} < D$ and $N_{RF} \times N_C \geq D$, the D-dimensional rotation constellation block is transmitted using $N_{RF}$ RF channels. Thus, the D-dimensional rotation constellation block is transmitted using more RF channels with increasing number of different integral values obtained by k mod $N_{RF}$.

In the case the number of different integral values obtained by k mod $N_{RF}$ is D except for $N_{RF} \geq D$ or $N_{RF} < D$ and $N_{RF} \times N_C \geq D$, the D-dimensional rotation constellation block is transmitted using D RF channels. The D-dimensional rotation constellation block is transmitted using more RF channels with increasing number of different integral values obtained by k mod D.

The D k values of the section usage set, which is selected such that the number of different integral values becomes the maximum, may be selected such that the number of identical integral values obtained by k mod $N_{RF}$ and k mod D becomes even as much as possible. In this case, the D rotation components of the D-dimensional rotation constellation block are evenly dispersed in the $N_{RF}$ RF channels as much as possible.

For example, for $D \leq N_{RF}$ and D=2, one row in which the k value satisfies k mod $N_{RF}$=0 and one row in which the k value satisfies k mod $N_{RF} \neq 0$ exist, respectively, in the two rows corresponding to one section.

For $D \leq N_{RF}$ and D=4, one row in which the k value satisfies k mod $N_{RF}$=0, one row in which the k value satisfies k mod $N_{RF}$=L, one row in which the k value satisfies k mod $N_{RF}$=M, and one row in which the k value satisfies k mod $N_{RF}$=N exist in the four rows corresponding to one section. Where L, M, and N are different integers of 1 or more.

The following way to select the factor k of W may be added to the way to select the factor k of W for the D rows corresponding to one section of the combined complex interleaver matrix. In the plurality of sections of the combined complex interleaver matrix, the set {0, 1, 2, . . . , (max{D,($N_{RF} \times N_C$)}−1)} is selected as the factor k of W at least once.

The maximum advantageous effect is obtained by evenly separating the D components of the D-dimensional rotation constellation block in the frequency and the space as much as possible.

TABLES 1 and 2 illustrate specific examples of cyclic shift patterns for D=2 and 4 based on the way to allocate the cyclic shift value. At this point, floor(Q/max{D,($N_{RF} \times$ $N_C)\}/2)$ (=W) cells are used as a unit for the number of RF channels $N_{RF}$ and the number of TFS cycles $N_C$. TABLES 1 and 2 illustrate a full shift pattern and a short shift pattern as the cyclic shift pattern.

In the short shift pattern, the full shift pattern is changes such that the variance of the D rotation components of the D-dimensional rotation constellation block in the time is decreased.

TABLE 1

SHIFT PATTERN FOR D = 2

| $N_{RF}$ | TFS CYCLE | floor (Q/max{D, ($N_{RF} \times N_C$)}/2) FULL SHIFT PATTERN IN CELL UNIT | floor (Q/max{D, ($N_{RF} \times N_C$)}/2) SHORT SHIFT PATTERN IN CELL UNIT |
|---|---|---|---|
| 2 | 1 | 0, 1 | — |
|   | 2 | 0, 1, 0, 3 | — |
|   | 3 | 0, 1, 0, 3, 0, 5 | 0, 3 |
|   | 4 | 0, 1, 0, 3, 0, 5, 0, 7 | 0, 3, 0, 5 |
| 3 | 1 | 0, 1, 0, 2 | — |
|   | 2 | 0.1, 0, 2, 0, 4, 0, 5 | 0, 2, 0, 4 |
|   | 3 | 0, 1, 0, 2, 0, 4, 0, 5, 0, 7, 0, 8 | 0, 4, 0, 5 |
|   | 4 | 0, 1, 0, 2, 0, 4, 0, 5, 0, 7, 0, 8, 0, 10, 0, 11 | 0, 5, 0, 7 |
| 4 | 1 | 0, 1, 0, 2, 0, 3 | — |
|   | 2 | 0, 1, 0, 2, 0, 3, 0, 5, 0, 6, 0, 7 | 0, 2, 0, 3, 0, 5, 0, 3, 0, 5, 0, 6 |
|   | 3 | 0, 1, 0, 2, 0, 3, 0, 5, 0, 6, 0, 7, 0, 9, 0, 10, 0, 11 | 0, 3, 0, 6, 0, 9 |
|   | 4 | 0.1, 0, 2, 0, 3, 0, 5, 0, 6.0, 7, 0, 9, 0, 10, 0, 11, 0, 13, 0, 14, 0, 15 | 0, 5, 0, 6, 0, 7, 0, 9, 0, 10, 0, 11 |

TABLE 2

SHIFT PATTERN FOR D = 4

| $N_{RF}$ | TFS CYCLE | floor (Q/max{D, ($N_{RF} \times N_C$)}/2) FULL SHIFT PATTERN IN CELL UNIT | floor (Q/max{D, ($N_{RF} \times N_C$)}/2) SHORT SHIFT PATTERN IN CELL UNIT |
|---|---|---|---|
| 2 | 1 | 0, 1, 2, 3 | — |
|   | 2 | 0, 1, 2, 3 | — |
|   | 3 | 0, 1, 2, 3, 0, 4, 5 | 0, 2, 3, 5 |
|   | 4 | 0, 1, 2, 3, 0, 4, 5, 6, 0, 7 | 0, 2, 5, 7 |
| 3 | 1 | 0, 1, 2, 3 | — |
|   | 2 | 0, 1, 2, 3, 0, 4, 5 | 0, 1, 2.4, 0, 2, 4, 5 |
|   | 3 | 0, 1, 2, 3, 0, 4, 5, 6, 0, 7, 8 | 0, 3, 5.7 |
|   | 4 | 0, 1, 2, 3, 0, 4, 5, 6, 0, 7, 8, 9, 0, 10, 11 | 0, 4, 6.8 |
| 4 | 1 | 0, 1, 2, 3 | — |
|   | 2 | 0, 1, 2, 3, 0, 5, 6, 7 | 0, 2, 3, 5, 0, 3, 5, 6 |
|   | 3 | 0, 1, 2, 3, 0, 5, 6, 7, 0, 9, 10, 11 | 0, 5, 6, 7 |
|   | 4 | 0, 1, 2, 3, 0, 5, 6, 7, 0, 9, 10, 11, 0, 13, 14, 15 | 0, 5, 6, 7, 0, 9, 10, 11 |

In TABLES 1 and 2, for $N_{RF} \geq D$, in the full shift pattern, the cyclic shift value for the leading row of each section is 0, and the values ($N_{RF} \times N_C$)−1 are sequentially arranged in the rows except for the leading row.

For $N_{RF} < D$, in the full shift pattern, the cyclic shift value for the leading row of each section is 0, and the values max{D,($N_{RF} \times N_C$)}−1 are sequentially arranged in the rows except for the leading row.

A relationship between the full shift pattern in TABLES 1 and 2 and the cyclic shift value used in the cyclic shift by component interleaver 160A will be described below.

In the leading row (assuming that i is a row index, the of i mod D=1) of each section of the whole combined complex interleaver matrix, component interleaver 160A performs the cyclic shift on (cyclic shift value 0×W) cells using {0} of the full shift pattern (equivalent to not performing the cyclic shift).

In each row except for the leading row of each section of the whole combined complex interleaver matrix, component interleaver 160A performs the cyclic shift on (cyclic shift value k×W) cells by repeatedly using the k values in the pattern except for {0} of the full shift pattern from the ascending order. That is, in a matrix in which the leading row is excluded from the whole combined complex interleaver matrix, the value in the pattern in which {0} is excluded from the full shift pattern is repeatedly used in each row except for the leading row in the ascending order.

For example, for D=4, $N_{RF}$=2, and $N_C$=2 in the full shift pattern, the following result is obtained.

Component interleaver 160A performs the cyclic shift on the four rows in the first section based on 0, 1, 2, and 3 from the leading row. Then, component interleaver 160A performs the cyclic shift on the four rows in the second section based on 0, 1, 2, and 3 from the leading row. The similar operation is repeated in the following section.

For example, for D=4, $N_{RF}$=3, and $N_C$=2 in the full shift pattern, the following result is obtained.

Component interleaver 160A performs the cyclic shift on the four rows in the first section based on 0, 1, 2, and 3 from the leading row. Then, component interleaver 160A performs the cyclic shift on the four rows in the second section based on 0, 4, 5, and 1 from the leading row. Then, component interleaver 160A performs the cyclic shift on the four rows in the third section based on 0, 2, 3, and 4 from the leading row. Then, component interleaver 160A performs the cyclic shift on the four rows in the fourth section based on 0, 5, 1, and 2 from the leading row. Then, component interleaver 160A performs the cyclic shift on the four rows in the fifth section based on 0, 3, 4, and 5 from the leading row. The similar operation is repeated in the following section.

In the short shift pattern, component interleaver 160A performs the allocation to each row of the combined complex interleaver matrix from the leading row by repeatedly using the short shift pattern.

Figure 18A:
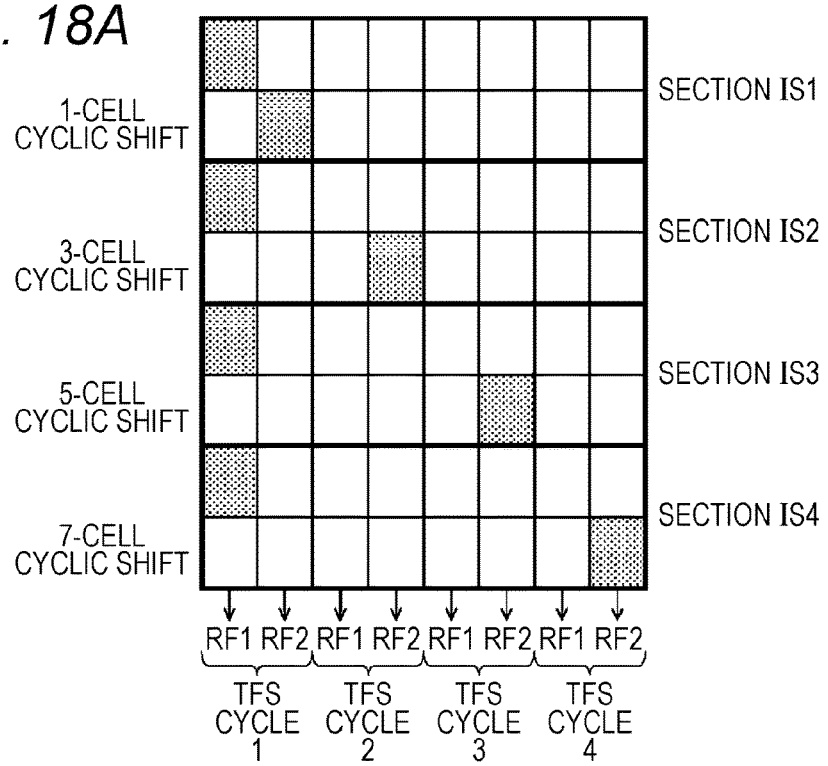
FIG. 18A is a view illustrating an example of the cyclic shift based on full and short shift patterns of the component interleaver in FIG. 17.
Figure 18B:
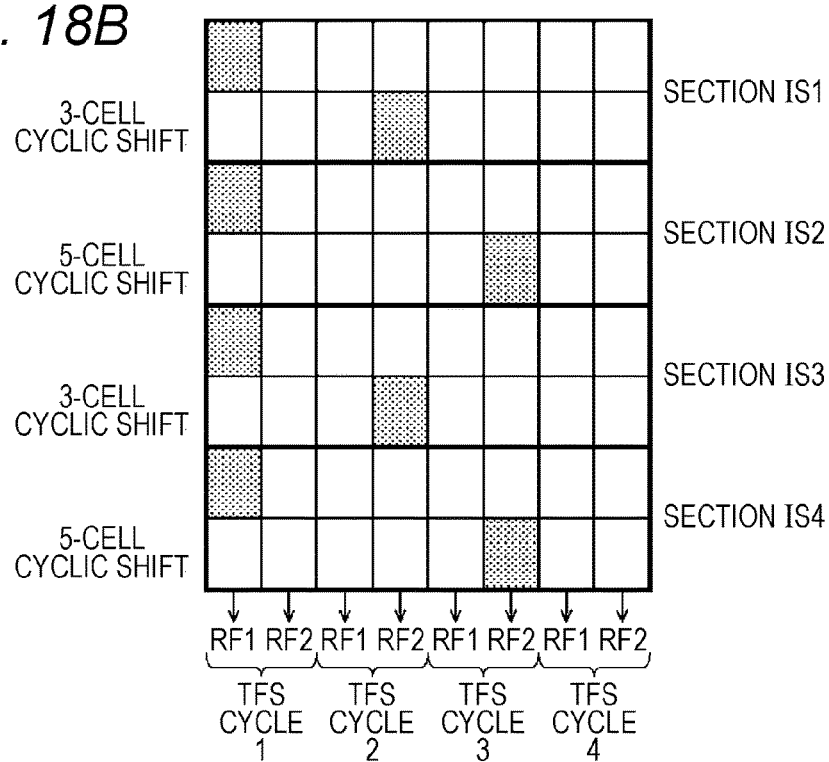
FIG. 18B is a view illustrating an example of the cyclic shift based on the full and short shift patterns of the component interleaver in FIG. 17.

FIGS. 18A and 18B illustrate the cell arrangements of the combined complex interleaver matrices cyclically shifted by component interleaver 160A based on the full shift pattern and short shift pattern for Q=16, D=2, $N_{RF}$=2, $N_C$=4, and N/M=4. At this point, the combined complex interleaver matrix has eight rows and eight columns (=((N/M)×D) rows and Q/2 columns). The cell in the first row of the pre-cyclic-shift combined complex interleaver matrix is hatched.

Because $N_{RF} \times N_C$=2×4=8 is larger than D=2 ($N_{RF} \times N_C$>D), W=floor(Q/max{D,($N_{RF} \times N_C$)}/2) cell=floor(Q/($N_{RF} \times N_C$)/2) cell=floor(16/(2×4)/2) cell=1 cell is obtained.

In the example of FIG. 18A, component interleaver 160A applies "no cyclic shift", "1-cell cyclic shift", "no cyclic shift", "3-cell cyclic shift", "no cyclic shift", "5-cell cyclic shift", "no cyclic shift", and "7-cell cyclic shift" from the leading row using the full shift pattern corresponding to $N_{RF}$=2 and $N_C$=4 of TABLE 1.

In the example of FIG. 18B, component interleaver 160A applies "no cyclic shift", "3-cell cyclic shift", "no cyclic shift", "5-cell cyclic shift", "no cyclic shift", "3-cell cyclic shift", "no cyclic shift", and "5-cell cyclic shift" from the leading row using the short shift pattern corresponding to $N_{RF}$=2 and $N_C$=4 of TABLE 1.

In FIGS. 18A and 18B, both an average shift value in the full shift pattern and an average shift value in the short shift pattern are 4. On the other hand, a variance of the shift value in the full shift pattern and a variance of the shift value in the short shift pattern are 6.667 and 2, respectively, and the variance in the short shift pattern is smaller than the variance in the full shift pattern.

The cyclic shift operation of component interleaver 160A will further be described with reference to FIGS. 19 and 20. FIGS. 19A and 20A illustrate pre-cyclic-shift combined complex interleaver matrices, and FIGS. 19B and 20B illustrate post-cyclic-shift combined complex interleaver matrices. In FIGS. 19A, 19B, 20A, and 20B, only the cell of the pre-cyclic-shift leading column in each of sections IS1 to IS4 is indicated by the square.

Figure 19A:
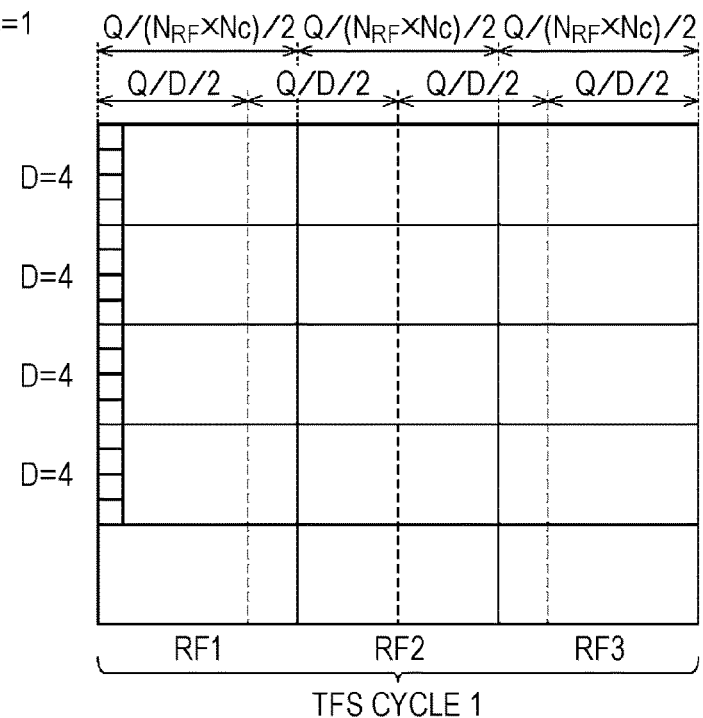
FIG. 19A is a view illustrating an example of the cyclic shift by the component interleaver in FIG. 17.
Figure 19B:
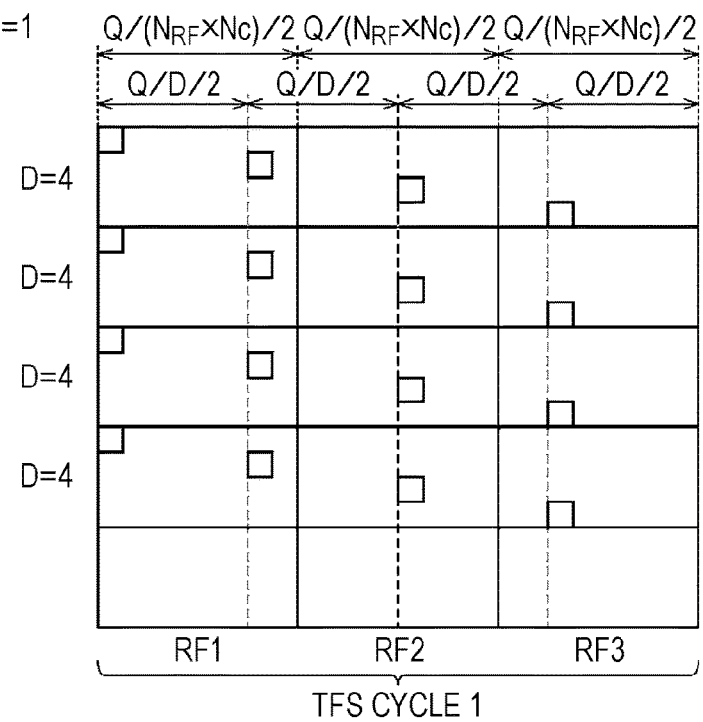
FIG. 19B is a view illustrating an example of the cyclic shift by the component interleaver in FIG. 17.

FIGS. 19A and 19B are views illustrating the cyclic shift in the case that component interleaver 160A uses the full shift pattern for D=4, $N_{RF}$=3, and $N_C$=1.

D=4 is larger than $N_{RF} \times N_C$=3×1=3 (D>$N_{RF} \times N_C$). For convenience, it is assumed that Q/2 is a multiple of D. W=floor(Q/max{D,($N_{RF} \times N_C$)}/2) cell=Q/D/2 is obtained.

For the full shift pattern in TABLE 2, component interleaver 160A selects 0, 1, 2, and 3 for each of the four rows of each section as the (cyclic shift value k×W) k values, and performs the cyclic shift for the cyclic shift value k×W based on the selected k values. As a result, FIG. 19B is obtained from FIG. 19A.

Figure 20A:
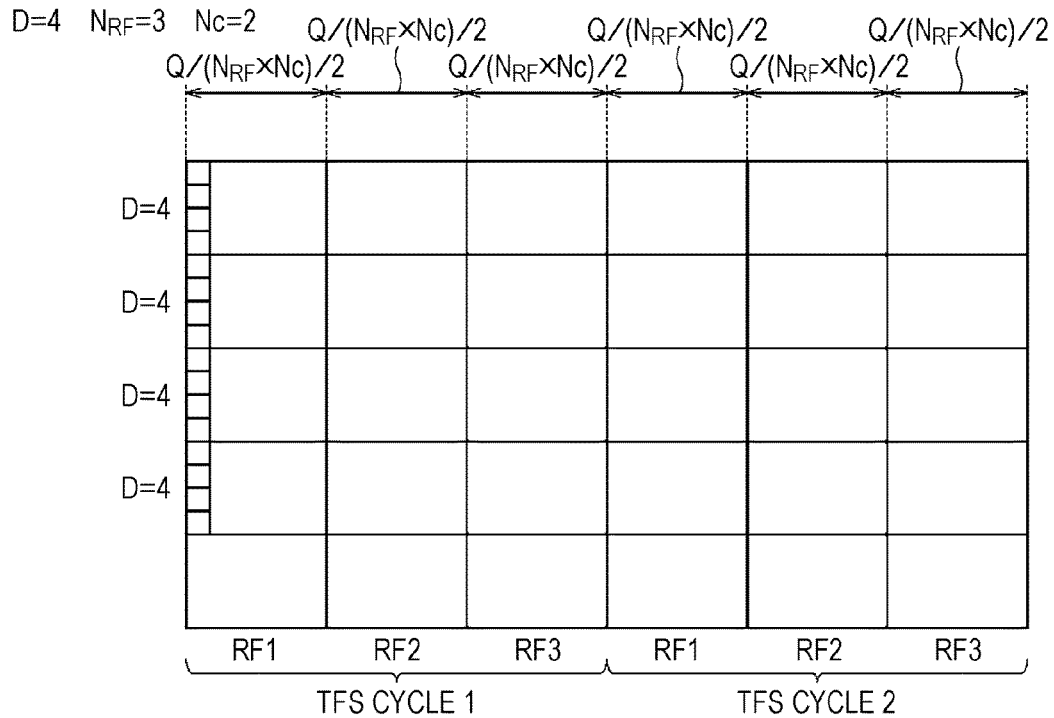
FIG. 20A is a view illustrating another example of the cyclic shift by the component interleaver in FIG. 17.
Figure 20B:
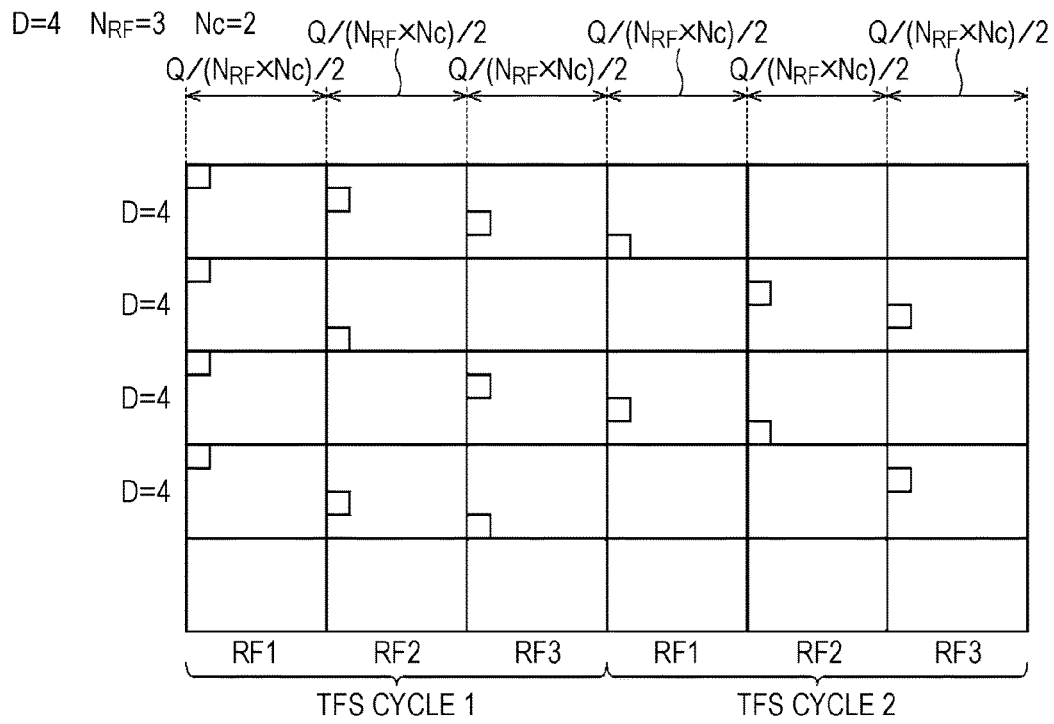
FIG. 20B is a view illustrating another example of the cyclic shift by the component interleaver in FIG. 17.

FIGS. 20A and 20B are views illustrating the cyclic shift performed by component interleaver 160A for D=4, $N_{RF}$=3, and $N_C$=2.

$N_{RF} \times N_C$=3×2=6 is larger than D=4 ($N_{RF} \times N_C$>D). For convenience, it is assumed that Q/2 is a multiple of $N_{RF} \times N_C$. W=floor(Q/max{D,($N_{RF} \times N_C$)}/2)cell=Q/($N_{RF} \times N_C$)/2 is obtained.

For the full shift pattern in TABLE 2, component interleaver 160A selects 0, 1, 2, and 3 for each of the four rows of the first section as the (cyclic shift value k×W) k values, selects 0, 4, 5, and 1 for each of the four rows of the second section, selects 0, 2, 3, and 4 for each of the four rows of the third section, and selects 0, 5, 1, and 2 for each of the four rows of the fourth section. Component interleaver 160A performs the cyclic shift for the cyclic shift value k×W based on the selected k values. As a result, FIG. 20B is obtained from FIG. 20A.

At this point, scheduler 180 divides the cells output from component interleaver 160A into ($N_{RF} \times N_C$) slices each of which includes the consecutively-output cells. Scheduler 180 sequentially allocates the ($N_{RF} \times N_C$) slices to the RF channels while repeating $N_{RF}$ RF channels.

All the slices except for the final slice include the cells for (floor{Q/($N_{RF} \times N_C$)/2}) columns of the combined complex interleaver matrix. The final slice includes the cells for ([Q/2−($N_{RF} \times N_C$−2)×floor{Q/($N_{RF} \times N_C$)/2}]/2) columns. The description can be used in both the case that Q/2 is a multiple of $N_{RF} \times N_C$ and the case that Q/2 is not the multiple of $N_{RF} \times N_C$.

A receiver according to an exemplary embodiment of the present disclosure will be described below with reference to the drawings.

Figure 21:
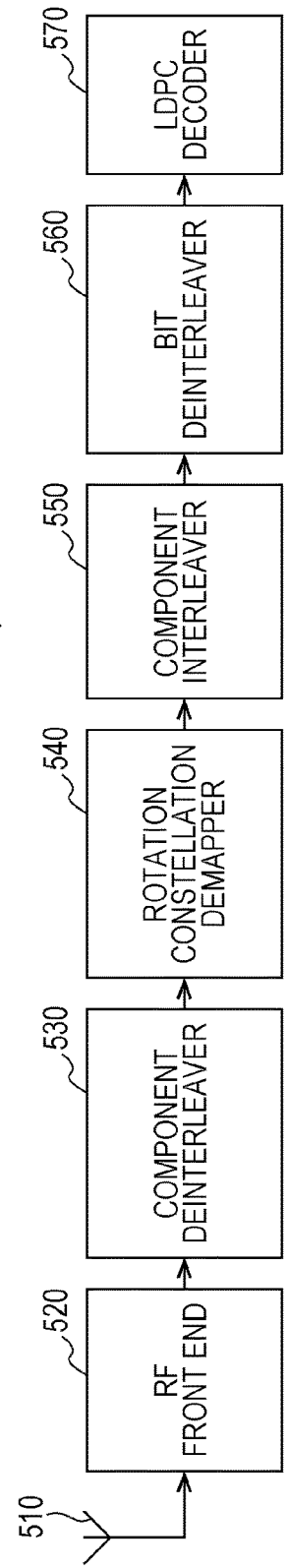
FIG. 21 is a block diagram illustrating a configuration example of a receiver according to an exemplary embodiment of the present disclosure.

FIG. 21 is a block diagram illustrating a configuration example of the receiver according to the exemplary embodiment of the present disclosure.

Receiver 500 reflects the function of transmitter 100A in FIG. 17, and includes reception antenna 510, RF front end 520, component deinterleaver 530, rotation constellation demapper 540, component interleaver 550, bit deinterleaver 560, and LDPC decoder 570.

RF front end 520 takes out ((N/M)×D×(Q/2)) complex symbols (cells) from the NRF RF channels according to TFS scheduling information, and outputs the ((N/M)×D×(Q/2)) complex symbols.

Component deinterleaver 530 performs processing equivalent to the following processing of returning the arrangement of the ((N/M)×D×(Q/2)) cells to the preceding arrangement of the arrangement performed by component interleaver 160A of transmitter 100A. A rearrangement rule opposite to the rearrangement rule of component interleaver 160A is used in the processing performed by component deinterleaver 530.

Component deinterleaver 530 writes the ((N/M)×D×(Q/2)) cells, in the column direction, in the combined complex interleaver matrix of D rows and (Q/2) columns in the order input from RF front end 520.

Then, component deinterleaver 530 performs the cyclic shift directly opposite to the cyclic shift performed by component interleaver 160A of transmitter 100A on each row of the combined complex interleaver matrix (in the case that the cyclic shift value used by component interleaver 160A is A, the cyclic shift value used by component deinterleaver 530 is −A).

Component deinterleaver 530 groups the post-cyclic-shift combined complex interleaver matrix of ((N/M)×D) rows and (Q/2) columns into the (N/M) complex interleaver matrices of D rows and (Q/2) columns. That is, the ((N/M)×D×(Q/2)) cells are grouped into the (N/M) sections each of which has the one-on-one correspondence relationship with the section of bit interleaver 120 of transmitter 100A. In each of the (N/M) sections, the complex interleaver matrix of D rows and (Q/2) columns is converted into the real interleaver matrix of D rows and Q columns such that the real component and imaginary component of one cell are arranged in the consecutive two columns in the identical row.

Then, component deinterleaver 530 reads the rotation components in the column direction from the real interleaver matrix of D rows and Q columns in each section, and outputs the rotation components in the reading order.

In each section, rotation constellation demapper 540 groups the D components consecutively input from component deinterleaver 530, sequentially performs de-mapping to take out a (soft) bit, and outputs the (soft) bit to component interleaver 550. Rotation constellation demapper 540 performs constellation rotator and QAM de-mapping on one block.

Component interleaver 550 performs processing equivalent to the following processing of returning the arrangement of ((N/M)×D×Q) B (soft) bits to the preceding arrangement of the arrangement performed by component deinterleaver 140A of transmitter 100A. A rearrangement rule opposite to the rearrangement rule of component deinterleaver 140A is used in the processing performed by component interleaver 550. The B (soft) bit corresponds to the component of component deinterleaver 140A. Hereinafter, a group of the B (soft) bits is referred to as a "(soft) bit group".

Component interleaver 550 writes the (D×Q) (soft) bit groups, in the column direction, in the interleaver matrix of D rows and Q columns with the rotation PAM symbol in the order input from rotation constellation demapper 540 in each section having the one-on-one correspondence relation with the section of component deinterleaver 530. Component interleaver 550 performs the cyclic shift directly opposite to the cyclic shift performed by component deinterleaver 140A of transmitter 100A (in the case that the cyclic shift value used by component deinterleaver 140A is A, the cyclic shift value used by component interleaver 550 is −A). Component interleaver 550 reads the (soft) bit groups in the column direction from the post-cyclic-shift interleaver matrix of D rows and Q columns, and outputs the (soft) bit groups in the reading order.

Bit deinterleaver 560 performs processing equivalent to the following processing of returning the arrangement of ((N/M)×Q×D×B=N×Q) B (soft) bits to the preceding arrangement of the arrangement performed by bit interleaver 120 of transmitter 100A. A rearrangement rule opposite to the rearrangement rule of bit interleaver 120 is used in the processing performed by bit deinterleaver 560.

Bit deinterleaver 560 writes the (soft) bits in the interleaver matrix of M rows and Q columns in the column direction in the order input from component interleaver 550 in each section having the one-on-one correspondence relation with the section of component deinterleaver 530, reads the (soft) bits from the interleaver matrix, and outputs the (soft) bits in the reading order.

In the case that the functions of performing QB permutation and/or the intra-QB permutation is added to transmitter 100A, a function of performing the interleaving having a rule opposite to the intra-QB permutation and/or the QB permutation may be added to bit deinterleaver 560 after the deinterleaving performed on the (soft) bits.

LDPC decoder 570 decodes deinterleaved (N×Q) (soft) bits. LDPC decoder 570 performs the decoding processing based on the coding processing performed by LDPC encoder 110 of transmitter 100A.

The cyclic shift performed by component interleaver 550 can be incorporated in the cyclic shift associated with the intra-QB permutation performed by bit deinterleaver 560. That is, the cyclic shift performed by component interleaver 550 can be incorporated in the definition of the LDPC code. Accordingly, it is not necessary that component interleaver 550 is implemented in hardware.

This is a particular advantage for the receiver in which iterative decoding is used.

Figure 22:
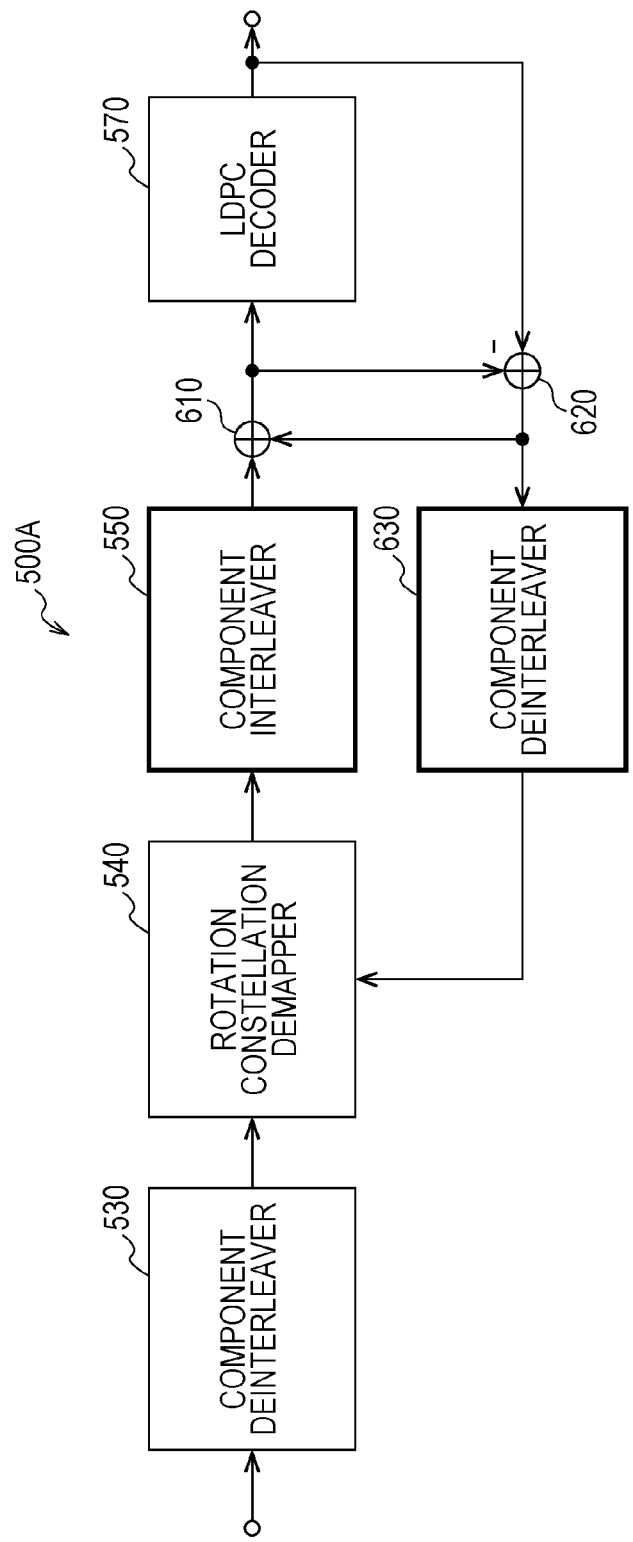
FIG. 22 is a block diagram illustrating another configuration example in the receiver of the exemplary embodiment of the present disclosure.

Receiver 500A in which the iterative decoding is used will be described below with reference to FIG. 22. In FIG. 22, the processing block performing the processing substantially identical to that in FIG. 21 is designated by the identical reference mark, and the overlapping description is omitted. At this point, the bit interleaver corresponding to bit interleaver 120 and a bit deinterleaver are not included because the bit interleaver and bit deinterleaver are not necessary for the hardware.

Receiver 500A includes component deinterleaver 530, rotation constellation demapper 540, component interleaver 550, adder 610, LDPC decoder 570, subtractor 620, and component deinterleaver 630. Because an iterative decoding basic principle is well known in the digital communication field, only the simple description is made.

In first-time iteration, rotation constellation demapper 540 performs cell blind (with no help of prior information) de-mapping without receiving the prior information (a-priori information), and outputs the soft bit (that is a scale of a posterior probability of the bit, and typically expressed as a log-likelihood ratio) obtained by the de-mapping. Component interleaver 550 performs the interleaving on the output of rotation constellation demapper 540. Adder 610 adds 0 to the output of component interleaver 550, and LDPC decoder 570 performs LDPC decoding on the output of adder 610.

In the iteration from second-time iteration, subtractor 620 subtracts the output of LDPC decoder 570 from the output of adder 610 to calculate external information (extrinsic information), and supplies the external information as the prior information to component deinterleaver 630.

Component deinterleaver 630 performs the deinterleaving on the output of subtractor 620, and outputs the deinterleaved prior information to rotation constellation demapper 540.

Rotation constellation demapper 540 performs the de^mapping using the cell and the prior information, and outputs the soft bit obtained by the de-mapping. Component interleaver 550 performs the interleaving on the output of rotation constellation demapper 540. Adder 610 adds the output of component interleaver 550 and the output of subtractor 620, and LDPC decoder 570 performs the LDPC decoding on the output of adder 610.

Component deinterleaver 630 writes (Q×D) pieces of external information in the interleaver matrix of D rows and Q columns in the column direction in the order input from subtractor 620 in each section having the one-on-one correspondence relation with the section of component interleaver 550. Component deinterleaver 630 performs the cyclic shift directly opposite to the cyclic shift performed by component interleaver 550 (in the case that the cyclic shift value used by component interleaver 550 is A, the cyclic shift value used by component deinterleaver 630 is −A). Component deinterleaver 630 reads the pieces of external information in the column direction from the post-cyclic-shift interleaver matrix of D rows and Q columns, and outputs the pieces of external information in the reading order.

Figure 23:
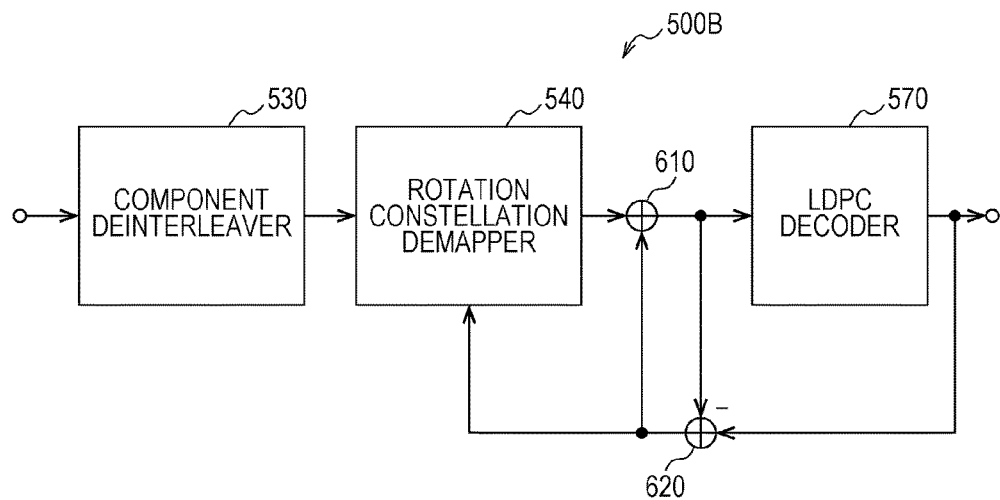
FIG. 23 is a block diagram illustrating still another configuration example of the receiver in the exemplary embodiment of the present disclosure.

Component interleaver 550 and component deinterleaver 630 are a part of an iterative decoding loop. Therefore, in the case that component interleaver 550 and component deinterleaver 630 perform the cyclic shifts, an iterative decoding decoder is simply implemented. The cyclic shifts performed by component interleaver 550 and component deinterleaver 630 can be incorporated in the definition of the LDPC code used by LDPC decoder 570 together with the cyclic shift of the bit deinterleaver. Accordingly, as illustrated in FIG. 23, in the structure of receiver 500B, component interleaver 550 and component deinterleaver 630 of receiver 500A are removed between rotation constellation demapper 540 and adder 610.

Therefore, rotation constellation demapper 540 and LDPC decoder 570 can be combined without a gap. As a result, the data can be exchanged with no latency.

Figure 24:
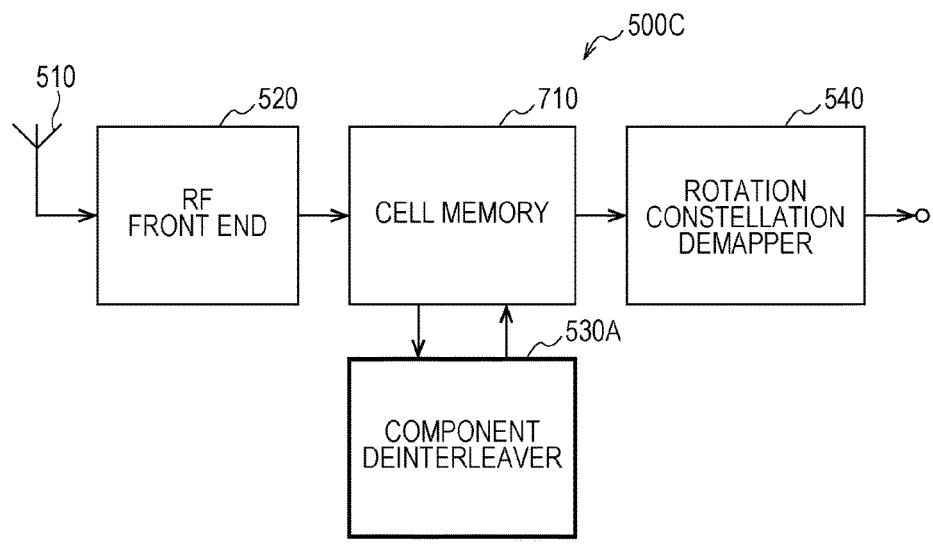
FIG. 24 is a block diagram illustrating yet another configuration example of the receiver in the exemplary embodiment of the present disclosure.

In addition to the optimization of the iterative decoding loop, component deinterleaver 530 existing outside the iterative decoding loop can efficiently be implemented. FIG. 24 illustrates how to implement the component deinterleaver.

Component deinterleaver 530A performs the following processing while replacing the D rows and Q columns of each section in which the real value of component deinterleaver 530 is used as the component with the D rows and (Q/2) columns in which the components of the consecutive two columns in the identical row are used as one cell. Component deinterleaver 530A reads Q/2 cells for one row of the matrix of D rows and (Q/2) columns in each section from cell memory 710 to perform the cyclic shift, and writes the Q/2 cells back in the identical place, namely, the identical address after the cyclic shift. Necessity of an additional memory is eliminated, and the cyclic shift is performed not in the whole FEC block but units of rows. Therefore, the latency is extremely decreased.

(Supplement)

The present disclosure is not limited to the exemplary embodiment, but the present disclosure can be implemented in any mode aimed at the achievement of the object of the present disclosure and the associated or attached object. For example, the present disclosure may be made as follows.

(1) In (DISCUSSION BY THE INVENTORS AND KNOWLEDGE OBTAINED BY INVENTORS) and (EXEMPLARY EMBODIMENT), N is the multiple of M. However, N is not always the multiple of M.

The case that N is not the multiple of M will be described below. The following description can also be applied to the case that N is the multiple of M.

The following processing is performed on the transmission side.

The rem(N,M) cyclic blocks is subtracted from the N cyclic blocks. The (N−rem(N,M)) cyclic blocks are grouped into floor(N/M) sections in each of which includes M cyclic blocks. The number of subtracted cyclic blocks ranges from 0 to M−1.

For example, preferably the subtracted rem(N,M) cyclic blocks is selected from a low-priority parity portion.

Bit interleaver 120, component deinterleaver 140A, constellation rotator 150, and component interleaver 160A perform the pieces of processing of (DISCUSSION BY THE INVENTORS AND KNOWLEDGE OBTAINED BY INVENTORS) and (EXEMPLARY EMBODIMENT) on each of the floor(N/M) sections.

However, bit interleaver 120 may or needs not to perform the bit arrangement on the rem(N,M) cyclic blocks. Component deinterleaver 140A may or needs not to perform the component arrangement. Constellation rotator 150 may or needs not to perform the rotation processing. Component interleaver 160A newly provides one or a plurality of rows (there is no particular limitation to the position of the newly-provided row) below the lowermost row of the combined complex interleaver matrix of (floor(N/M)×D) rows and (Q/2) columns produced from floor(N/M) complex interleaver matrices. The PAM symbol or rotation PAM symbol produced from the rem(N,M) cyclic blocks is arranged in the one or plurality of rows to update the combined complex interleaver matrix. Component interleaver 160A may or needs not to perform the cyclic shift on the newly-added portion.

The following processing is performed on the reception side.

Component deinterleaver 530 writes the cells in the combined complex interleaver matrix having the size identical to that of the updated combined complex interleaver matrix on the transmission side in the column direction in the order input from RF front end 520. The cyclic shift processing of (EXEMPLARY EMBODIMENT) is performed on the portion corresponding to the transmission-side floor(N/M) sections of the combined complex interleaver matrix. The cyclic shift is not performed on the portion corresponding to the rem(N,M) cyclic blocks in the case that the cyclic shift is not performed on the transmission side, and the opposite cyclic shift is performed in the case that cyclic shift is performed. The post-cyclic-shift combined complex interleaver matrix is divided into the complex interleaver matrix of the section corresponding to each of the transmission-side floor(N/M) sections and the matrix corresponding to the rem(N,M) cyclic blocks. Component deinterleaver 530 performs the processing of (EXEMPLARY EMBODIMENT) on the floor(N/M) sections, and performs the processing of reading the cells such that the arrangement of matrix corresponding to the rem(N,M) cyclic blocks becomes the pre-input arrangement of the transmission-side component interleaver 160A.

Rotation constellation demapper 540, component interleaver 550, and bit deinterleaver 560 perform the processing of (EXEMPLARY EMBODIMENT) on each section having the one-on-one correspondence relation with the transmission-side floor (N/M) sections.

In the portion corresponding to the rem(N,M) cyclic blocks, rotation constellation demapper 540 performs the de-mapping in consideration of the rotation in the case that the rotation processing is performed on the transmission side, and rotation constellation demapper 540 performs the de-mapping without considering the rotation in the case that the rotation processing is not performed on the transmission side. Component interleaver 550 does not perform the rearrangement in the case that the component is not rearranged on the transmission side, and component interleaver 550 performs the opposite rearrangement in the case that the rearrangement is performed on the transmission side. Bit deinterleaver 560 does not perform the rearrangement in the case that the bit is not rearranged on the transmission side, and component interleaver 550 performs the opposite rearrangement in the case that the rearrangement is performed on the transmission side.

Component deinterleaver 630 performs the processing of (EXEMPLARY EMBODIMENT) on each section having the one-on-one correspondence relation with the transmission-side floor (N/M) sections. In the portion corresponding to the rem(N,M) cyclic blocks, component deinterleaver 630 does not perform the rearrangement in the case that component interleaver 550 does not perform the rearrangement, and component deinterleaver 630 performs the opposite rearrangement in the case that the rearrangement is performed.

Component deinterleaver 530 performs the processing of (EXEMPLARY EMBODIMENT) on each section having the one-on-one correspondence relation with the transmission-side floor (N/M) sections. In the portion corresponding to the rem(N,M) cyclic blocks, component deinterleaver 530 does not perform the rearrangement in the case that the rearrangement is not performed on the transmission side, and component deinterleaver 530 performs the opposite rearrangement in the case that the rearrangement is performed.

TABLES 3 and 4 illustrate the number of sections and the number of excluded cyclic blocks with respect to 16k LDPC codeword and 64k LDPC codeword, which are usually used in the DVB-T2 or DVB-NGH.

TABLE 3

THE NUMBER OF SECTIONS AND THE NUMBER OF EXCLUDED CYCLIC BLOCKS IN 16k LDPC CODEWORD

| D | B | MODULATION SCHEME | THE NUMBER OF SECTIONS | THE NUMBER OF EXCLUDED CYCLIC BLOCKS |
|---|---|---|---|---|
| 2 | 1 | QPSK | 22 | 1 |
|   | 2 | 16QAM | 11 | 1 |
|   | 3 | 64QAM | 7 | 3 |
|   | 4 | 256QAM | 5 | 5 |
| 4 | 1 | QPSK | 11 | 1 |
|   | 2 | 16QAM | 5 | 5 |
|   | 3 | 64QAM | 3 | 9 |
|   | 4 | 256QAM | 2 | 13 |

TABLE 4

THE NUMBER OF SECTIONS AND THE NUMBER OF EXCLUDED CYCLIC BLOCKS IN 64k LDPC CODEWORD

| D | B | MODULATION SCHEME | THE NUMBER OF SECTIONS | THE NUMBER OF EXCLUDED CYCLIC BLOCKS |
|---|---|---|---|---|
| 2 | 1 | QPSK | 90 | 0 |
|   | 2 | 16QAM | 45 | 0 |
|   | 3 | 64QAM | 30 | 0 |
|   | 4 | 256QAM | 22 | 4 |
| 4 | 1 | QPSK | 45 | 0 |
|   | 2 | 16QAM | 22 | 4 |
|   | 3 | 64QAM | 15 | 0 |
|   | 4 | 256QAM | 11 | 4 |

(2) The values of the parameters such as Q, N, M, and B are described in the exemplary embodiment by way of example. Alternatively, the parameters may have different values.

(3) In the exemplary embodiment, the modulated multiplex numbers of all the PAM symbols produced by PAM mapper 130 are equal to one another (all the PAM symbols are produced from the B bits).

Alternatively, the modulated multiplex numbers of all the PAM symbols may be equal to one another, or the modulated multiplex numbers of all the PAM symbols may be equal to one another in some of the PAM symbols (the PAM symbol having different modulated multiplex number may be produced).

A specific example will be described below.

For the two-dimensional vector (two-dimensional constellation block), both the two PAM symbols are the 4-PAM symbol (B=2). Alternatively, one of the PAM symbols is the 2-PAM symbol (B=1) while the other PAM symbol is the 4-PAM symbol (B=2).

In the case that each of the PAM symbols of all the D dimensions in the D-dimensional vector includes B bits, for example, M is B×D as described above.

In the case that each of the PAM symbols of dimension i (i=1, 2, . . . , D) in the D-dimensional vector includes B(i) bits, for example, M is B(1)+B(2)+ . . . +B(D). In this case, $(2^{B(1)}) \times (2^{B(2)}) \times \ldots \times (2^{B(D)})$ D-dimensional vectors constitute the D-dimensional constellation.

(4) The exemplary embodiment may be associated with the implementation using hardware and software. The exemplary embodiment may be implemented or performed using a computing device (processor). For example, the computing device or processor may be a main processor/general-purpose processor, a digital signal processor (DSP), an ASIC (application specific integrated circuit), an FPGA (field programmable gate array), and other programmable logic devices. The exemplary embodiment may be performed or implemented by connection of these devices.

(5) The exemplary embodiment may be performed by the processor or directly performed by the hardware, or implemented by a mechanism of a software module. The software module and the hardware implementation can also be combined. The software module may be stored in various computer-readable storage mediums such as a RAM, an EPROM, an EEPROM, a flash memory, a register, a hard disk, a CD-ROM, and a DVD.

(Supplement (Part 2))

The transmission method, transmitter, reception method, and receiver of the exemplary embodiment and advantages thereof are summarized.

(1) A first transmission method is a transmission method for transmitting one coded block over $N_{RF}$ ($N_{RF}$ is an integer of 2 or more) frequency channels and $N_C$ ($N_C$ is an integer of 1 or more) cycles by dividing the one coded block into a plurality of slices, the transmission method including: coding a data block by using a quasi-cyclic low-density parity check (QC LDPC) code to generate a coded block, the coded block including N cyclic blocks, each of the N cyclic blocks including Q bits, each of the N cyclic blocks being divided into floor(N/M) sections and rem{N,M} cyclic blocks, each of the floor(N/M) sections including M cyclic blocks; generating a D-dimensional constellation block including D components from (Q×M) bits of corresponding one of the sections, each of the D of components being a real value; generating a D-dimensional rotation constellation block including D rotation components from each of the D-dimensional constellation blocks of the sections by using an orthogonal matrix of D rows and D columns, each of the D rotation components being a real value; and mapping each of the rotation components of the D-dimensional rotation constellation blocks of each of the sections to one frequency channel of the $N_{RF}$ frequency channels. At this point, the mapping of each of the rotation components to the one frequency channel is performed by performing processing equivalent to: in each of the sections, writing the (D×Q) rotation components, in a column direction, in a real interleaver matrix of D rows and Q columns and converting the real interleaver matrix into a complex interleaver matrix of D rows and (Q/2) columns in which rotation components of two consecutive columns in an identical row are replaced with a cell that is of one complex value; coupling the complex interleaver matrix of D rows and (Q/2) columns for each of the sections to generate a combined complex interleaver matrix of ({floor(N/M)}×D) rows and (Q/2) columns by arranging the complex interleaver matrix of D rows and (Q/2) columns for each of the sections; applying a cyclic shift to each row of the combined complex interleaver matrix by using (cyclic shift value k×floor(Q/max{D,($N_{RF}$ $N_C$)}/2)) cells allocated to the row; and mapping cells as many as a number of consecutive columns defined by Q/2 of the post-cyclic-shift combined complex value interleaver matrix and $N_{RF} \times N_C$ in the frequency channels while sequentially repeating the $N_{RF}$ frequency channels, and the cyclic shift is performed such that k that has a value equal to 2 or more is used at least once in each of the sections, the value of k being predetermined from values ranging from 0 to max{D,($N_{RF} \times N_C$)}−1.

Accordingly, the D rotation components of the D-dimensional rotation constellation block can be transmitted through at least two frequency channels, and the improvement of the reception performance is achieved.

(2) A second transmission method is one in which, in the first transmission method, when D is 2, in one section portion of the combined complex interleaver matrix, the value of k for one of the columns is set to a value satisfying k mod $N_{RF}$=0, and the value of k for the other column is set to a value satisfying k mod $N_{RF} \neq 0$.

Accordingly, the two rotation components of the two-dimensional rotation constellation block can be transmitted through the frequency channels different from each other, and the further improvement of the reception performance is achieved.

(3) A third transmission method is one in which, in the first transmission method, when D is 4 and is less than or equal to $N_{RF}$, a row in which a value of k satisfies k mod $N_{RF}$=0, a row in which a value of k satisfies k mod $N_{RF}$=L, a row in which a value of k satisfies k mod $N_{RF}$=M, and a row in which a value of k satisfies k mod $N_{RF}$=N exist in one section portion of the combined complex interleaver matrix, and the L, M, and N are integers equal to 1 or more that are different from each other.

Accordingly, the four rotation components of the four-dimensional rotation constellation block can be transmitted through the frequency channels different from each other, and the further improvement of the reception performance is achieved.

(4) A first reception method is a reception method for receiving one coded block over $N_{RF}$ ($N_{RF}$ is an integer of 2 or more) frequency channels and $N_C$ ($N_C$ is an integer of 1 or more) cycles by dividing the one coded block into a plurality of slices, the reception method including: receiving a plurality of cells from the $N_{RF}$ ($N_{RF}$ is an integer of 2 or more) frequency channels according to a time-frequency slicing schedule information; mapping a real component and an imaginary component of each of the plurality of cells to D real-value rotation components of a plurality of D-dimensional rotation constellation blocks, based on a mapping rule for mapping the real value rotation components to the frequency channels; and decoding the plurality of D-dimensional rotation constellation block using a quasi-cyclic low-density parity check code.

Accordingly, the D rotation components of the D-dimensional rotation constellation block can be transmitted through at least two frequency channels, and the improvement of the reception performance is achieved.

(5) A first transmitter is a transmitter that transmits one coded block over $N_{RF}$ ($N_{RF}$ is an integer of 2 or more) frequency channels and $N_C$ ($N_C$ is an integer of 1 or more) cycles by dividing the one coded block into a plurality of slices. At this point, the transmitter: codes a data block by using a quasi-cyclic low-density parity check (QC LDPC) code to generate a coded block, the coded block including N cyclic blocks, each of the N cyclic blocks including Q bits, each of the N cyclic blocks being divided into floor(N/M) sections and rem{N,M} cyclic blocks, each of the floor(N/M) sections including M cyclic blocks; generates a D-dimensional constellation block including D components from (Q×M) bits of the section in each of the sections, each of the D components being a real value; generates a D-dimensional rotation constellation block including D rotation components from each of the D-dimensional constellation blocks of the sections by using an orthogonal matrix of D rows and D columns, each of the D rotation components being a real value; and maps each of the rotation components of the D-dimensional rotation constellation blocks of each of the sections to one frequency channel of the $N_{RF}$ frequency channels. At this point, the mapping of the each of the rotation components to the one frequency channel is performed by performing processing equivalent to: in each of the sections, writing the (D×Q) rotation components, in a column direction, in a real interleaver matrix of D rows and Q columns and converting the real interleaver matrix into a complex interleaver matrix of D rows and (Q/2) columns in which rotation components of two consecutive columns in an identical row are replaced with a cell that is of one complex value; coupling the complex interleaver matrix of D rows and (Q/2) columns for each of the sections to generate a combined complex interleaver matrix of ({floor (N/M)}×D) rows and (Q/2) columns by arranging the complex interleaver matrix of D rows and (Q/2) columns for each of the sections; applying a cyclic shift to each row of the combined complex interleaver matrix by using (cyclic shift value k×floor(Q/max{D,($N_{RF}$×$N_C$)}/2)) cells allocated to the row; and mapping cells as many as a number of consecutive columns defined by Q/2 of the post-cyclic-shift combined complex value interleaver matrix and $N_{RF}$×$N_C$ in the frequency channels while sequentially repeating the $N_{RF}$ frequency channels, and the cyclic shift is performed such that k that has a value equal to 2 or more is used at least once in each of the sections, the value of k being predetermined from values ranging from 0 to max{D,($N_{RF}$×$N_C$)}−1.

Accordingly, the D rotation components of the D-dimensional rotation constellation block can be transmitted through at least two frequency channels, and the improvement of the reception performance is achieved.

(6) A first receiver is a receiver that receives one coded block over $N_{RF}$ ($N_{RF}$ is an integer of 2 or more) frequency channels and $N_C$ ($N_C$ is an integer of 1 or more) cycles by dividing the one coded block into a plurality of slices. At this point, the receiver: receives a plurality of cells from the $N_{RF}$ ($N_{RF}$ is an integer of 2 or more) frequency channels according to a time-frequency slicing schedule information; maps a real component and an imaginary component of each of the plurality of cells to D real-value rotation components of a plurality of D-dimensional rotation constellation blocks, based on a mapping rule for mapping the real value rotation components to the frequency channel; and decodes the plurality of D-dimensional rotation constellation block using a quasi-cyclic low-density parity check code.

Accordingly, the D rotation components of the D-dimensional rotation constellation block can be transmitted through at least two frequency channels, and the improvement of the reception performance is achieved.

The present disclosure can be used in the communication system in which the rotation constellation and the plurality of frequency channels are used together with the quasi-cyclic low-density parity check code.

What is claimed is:

1. A transmission method for transmitting one coded block over $N_{RF}$ ($N_{RF}$ is an integer of 2 or more) frequency channels and $N_C$ ($N_C$ is an integer of 1 or more) cycles by dividing the one coded block into a plurality of slices, the transmission method comprising:
    coding, using transmission circuitry, a data block by using a quasi-cyclic low-density parity check (QC LDPC) code to generate a coded block, the coded block including a number N of cyclic blocks, each of the N cyclic blocks including a number Q of bits, each of the N cyclic blocks being divided into floor(N/M) sections and rem{N,M} cyclic blocks, each of the floor(N/M) sections including M cyclic blocks, where M is an integer;
    generating, using the transmission circuitry, a D-dimensional constellation block including a number D of components from (Q×M) bits of corresponding one of the floor(N/M) sections, each of the D number of components being a real value;
    generating, using the transmission circuitry, a D-dimensional rotation constellation block including D rotation components from each of the D-dimensional constellation blocks of the sections by using an orthogonal matrix of D of rows and D columns, each of the D rotation components being a real value;
    mapping, using the transmission circuitry, each of the D rotation components of the D-dimensional rotation constellation blocks of each of the floor(N/M) sections to one frequency channel of the $N_{RF}$ frequency channels; and
    transmitting the coded block,
    wherein the mapping of each of the D rotation components to the one frequency channel is performed by:

in each of the floor(N/M) sections, writing the D rotation components, in a column direction, in a real interleaver matrix of D rows and Q columns and converting the real interleaver matrix into a complex interleaver matrix of D rows and (Q/2) columns in which the D rotation components of two consecutive columns in an identical row are replaced with a cell that is of one complex value;

coupling the complex interleaver matrix of D rows and (Q/2) columns for each of the floor(N/M) sections to generate a combined complex interleaver matrix of ({floor(N/M)}×D) rows and (Q/2) columns by arranging the complex interleaver matrix of D rows and (Q/2) columns for each of the floor(N/M) sections;

applying a cyclic shift to each row of the combined complex interleaver matrix by shifting cells allocated to the row using a cyclic shift value of (k×floor(Q/max{D, $(N_{RF} \times N_C)$}/2)); and mapping cells into a number of columns defined by Q/2 multiplied by $N_{RF} \times N_C$ while sequentially repeating the $N_{RF}$ frequency channels, and the cyclic shift is performed such that k has a value equal to 2 or more at least once in each of the floor(N/M) sections, the value of k being predetermined from values ranging from 0 to max{D,$(N_{RF} \times N_C)$}−1.

2. The transmission method according to claim 1, wherein, when D is 2, the value of k for a first column is set to a value satisfying k mod $N_{RF}$=0 while the value of k for a second column is set to a value satisfying k mod $N_{RF} \neq 0$ in one section portion of the combined complex interleaver matrix.

3. The transmission method according to claim 1, wherein, when D is 4 and is less than or equal to $N_{RF}$, a row in which a value of k satisfies k mod $N_{RF}$=0, a row in which a value of k satisfies k mod $N_{RF}$=L, a row in which a value of k satisfies k mod $N_{RF}$=M, and a row in which a value of k satisfies k mod $N_{RF}$=N exist in one section portion of the combined complex interleaver matrix, and the L, M, and N are integers equal to 1 or more that are different from each other.

4. A reception method for receiving one coded block over $N_{RF}$ ($N_{RF}$ is an integer of 2 or more) frequency channels and $N_C$ ($N_C$ is an integer of 1 or more) cycles by dividing the one coded block into a plurality of slices, the reception method comprising:

receiving a plurality of cells from the $N_{RF}$ ($N_{RF}$ is an integer of 2 or more) frequency channels according to a time-frequency slicing schedule information;

mapping a real component and an imaginary component of each of the plurality of cells to a number D of real-value rotation components of a plurality of D-dimensional rotation constellation blocks, based on a mapping rule for mapping the real value rotation components to frequency channels; and decoding the plurality of D-dimensional rotation constellation blocks using a quasi-cyclic low-density parity check code.

5. A transmitter that transmits one coded block over $N_{RF}$ ($N_{RF}$ is an integer of 2 or more) frequency channels and $N_C$ ($N_C$ is an integer of 1 or more) cycles by dividing the one coded block into a plurality of slices, wherein the transmitter:

codes a data block by using a quasi-cyclic low-density parity check (QC LDPC) code to generate a coded block, the coded block including a number N of cyclic blocks, each of the N cyclic blocks including a number Q of bits, each of the N cyclic blocks being divided into floor(N/M) sections and rem{N,M} cyclic blocks, each of the floor(N/M) sections including M cyclic blocks, where M is an integer;

generates a D-dimensional constellation block including a number D of components from (Q×M) bits of the floor(N/M) section in each of the floor(N/M) sections, each of the D components being a real value;

generates a D-dimensional rotation constellation block including D rotation components from each of the D-dimensional constellation blocks of the sections by using an orthogonal matrix of D rows and D columns, each of the D rotation components being a real value;

maps each of the D rotation components of the D-dimensional rotation constellation blocks of each of the floor(N/M) sections to one frequency channel of the $N_{RF}$ frequency channels; and transmits the coded block, wherein, the mapping of the each of the rotation components to the one frequency channel is performed by:

in each of the floor(N/M) sections, writing the (D×Q) rotation components, in a column direction, in a real interleaver matrix of D rows and Q columns and converting the real interleaver matrix into a complex interleaver matrix of D rows and (Q/2) columns in which the D rotation components of two consecutive columns in an identical row are replaced with a cell that is of one complex value;

coupling the complex interleaver matrix of D rows and (Q/2) columns for each of the floor(N/M) sections to generate a combined complex interleaver matrix of ({floor(N/M)}×D) rows and (Q/2) columns by arranging the complex interleaver matrix of D rows and (Q/2) columns for each of the floor(N/M) sections;

applying a cyclic shift to each row of the combined complex interleaver matrix by shifting cells allocated to the row using a cyclic shift value of (k×floor(Q/max{D, $(N_{RF} \times N_C)$}/2)); and mapping cells into a number of columns defined by Q/2 multiplied by $N_{RF} \times N_C$ while sequentially repeating the $N_{RF}$ frequency channels, and the cyclic shift is performed such that k has a value equal to 2 or more at least once in each of the floor(N/M) sections, the value of k being predetermined from values ranging from 0 to max{D,$(N_{RF} \times N_C)$}−1.

6. A receiver that receives one coded block over $N_{RF}$ ($N_{RF}$ is an integer of 2 or more) frequency channels and $N_C$ ($N_C$ is an integer of 1 or more) cycles by dividing the one coded block into a plurality of slices, wherein the receiver:

receives a plurality of cells from the $N_{RF}$ ($N_{RF}$ is an integer of 2 or more) frequency channels according to a time-frequency slicing schedule information;

maps a real component and an imaginary component of each of the plurality of cells to a number D of real-value rotation components of a plurality of D-dimensional rotation constellation blocks, based on a mapping rule for mapping the real value rotation components to the frequency channel; and decodes the plurality of D-dimensional rotation constellation blocks using a quasi-cyclic low-density parity check code.

* * * * *